United States Patent
Ogomi et al.

(10) Patent No.: US 9,279,866 B2
(45) Date of Patent: Mar. 8, 2016

(54) MAGNETIC SENSOR

(71) Applicant: Mitsubishi Electric Corporation, Chiyoda-ku (JP)

(72) Inventors: Tomokazu Ogomi, Chiyoda-ku (JP); Kenji Shimohata, Chiyoda-ku (JP); Hiroyuki Asano, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/391,299

(22) PCT Filed: Apr. 2, 2013

(86) PCT No.: PCT/JP2013/060028
§ 371 (c)(1),
(2) Date: Oct. 8, 2014

(87) PCT Pub. No.: WO2013/153986
PCT Pub. Date: Oct. 17, 2013

(65) Prior Publication Data
US 2015/0102808 A1    Apr. 16, 2015

(30) Foreign Application Priority Data

Apr. 9, 2012  (JP) ................................. 2012-088501
Apr. 9, 2012  (JP) ................................. 2012-088502

(51) Int. Cl.
*G01R 33/09* (2006.01)
*H01L 43/02* (2006.01)
*H01L 43/08* (2006.01)

(52) U.S. Cl.
CPC .............. *G01R 33/09* (2013.01); *G01R 33/096* (2013.01); *H01L 43/02* (2013.01); *H01L 43/08* (2013.01)

(58) Field of Classification Search
CPC ........ G01R 33/02; G01R 33/09; G01R 33/096; G01R 33/098; G01R 33/093; G07D 7/00; G07D 7/004; G07D 7/02; G07D 7/04; G07D 7/06; H01L 43/02; H01L 43/08
USPC .......................... 324/252, 260, 244; 338/32 R
See application file for complete search history.

(56) References Cited

U.S. PATENT DOCUMENTS 5,512,822 A * 4/1996 Masuda .......................... 324/235
5,627,466 A * 5/1997 Spies ...................... G01D 5/145
                                                    324/207.12

(Continued)

FOREIGN PATENT DOCUMENTS

JP    58-002994    1/1983
JP    62-041266    10/1987

(Continued)

OTHER PUBLICATIONS

Office Action issued Feb. 24, 2015 in Japanese Patent Application No. 2012-088502 (with English language translation).

(Continued)

*Primary Examiner* — Melissa Koval
*Assistant Examiner* — Rahul Maini
(74) *Attorney, Agent, or Firm* — Oblon, McClelland, Maier & Neustadt, L.L.P.

(57) ABSTRACT

A magnet is disposed on one face of a hollow section which is the conveyance path of an object of detection, and has a magnetic pole of designated length along the conveyance direction of the object of detection. A magnetic body is disposed along the conveyance direction opposite the magnet with the hollow section therebetween, and generates a cross magnetic field that crosses the hollow section formed between the magnetic body and the magnet. An anisotropic magnetoresistance element is disposed on the side of the magnetic body carrier facing the hollow section, and has magneto-sensing action in the conveyance direction.

8 Claims, 22 Drawing Sheets

(56) References Cited

U.S. PATENT DOCUMENTS

| | | | |
|---|---|---|---|
| 5,638,222 A * | 6/1997 | Shigehara | 359/814 |
| 5,703,733 A | 12/1997 | Suzuki et al. | |
| 6,310,475 B1 * | 10/2001 | Kawase | G01D 5/145 |
| | | | 194/317 |
| 6,900,713 B2 * | 5/2005 | Kasashima et al. | 335/207 |
| 7,019,607 B2 * | 3/2006 | Busch | 335/207 |
| 2010/0156405 A1 | 6/2010 | Furukawa et al. | |
| 2010/0219245 A1 * | 9/2010 | Schutzmann | B42D 25/355 |
| | | | 235/449 |
| 2011/0187350 A1 * | 8/2011 | Ausserlechner et al. | 324/202 |
| 2011/0273174 A1 * | 11/2011 | Imatani et al. | 324/252 |
| 2013/0119980 A1 * | 5/2013 | Ogomi | G01R 33/091 |
| | | | 324/252 |
| 2013/0127457 A1 * | 5/2013 | Musha | B82Y 25/00 |
| | | | 324/252 |
| 2014/0028308 A1 * | 1/2014 | Ogomi | G01R 33/096 |
| | | | 324/252 |
| 2015/0102808 A1 * | 4/2015 | Ogomi | G01R 33/096 |
| | | | 324/252 |

FOREIGN PATENT DOCUMENTS

| | | | | |
|---|---|---|---|---|
| JP | 05-332703 | 12/1993 | | |
| JP | 06-018278 | 1/1994 | | |
| JP | 06-111251 | 4/1994 | | |
| JP | 06-167302 | 6/1994 | | |
| JP | 06-231336 | 8/1994 | | |
| JP | 07-012908 | 1/1995 | | |
| JP | 07-210833 | 8/1995 | | |
| JP | 08-086848 | 4/1996 | | |
| JP | 08-178937 | 7/1996 | | |
| JP | 08178937 A * | 7/1996 | | G01P 3/488 |
| JP | 08-249602 | 9/1996 | | |
| JP | 09-152303 | 6/1997 | | |
| JP | 10-019601 | 1/1998 | | |
| JP | 10019601 A * | 1/1998 | | G01D 5/245 |
| JP | 10-153454 | 6/1998 | | |
| JP | 2000-105847 | 4/2000 | | |
| JP | 2001-021631 | 1/2001 | | |
| JP | 2002-131406 | 5/2002 | | |
| JP | 2005-129009 | 5/2005 | | |
| JP | 2006-317218 | 11/2006 | | |
| JP | 2007-226674 A | 9/2007 | | |
| JP | 2008-145379 | 6/2008 | | |
| JP | WO 2010052797 A1 * | 5/2010 | | G01N 27/82 |
| JP | 2012-122983 | 6/2012 | | |
| JP | 2012-215405 | 11/2012 | | |
| JP | 2012-255770 | 12/2012 | | |
| WO | 2008/146809 | 12/2008 | | |
| WO | 2010/052797 | 5/2010 | | |
| WO | 2012/014546 | 2/2012 | | |
| WO | 2012/015012 | 2/2012 | | |
| WO | 2012/157558 | 11/2012 | | |

OTHER PUBLICATIONS

International Search Report Issued Jun. 11, 2013 in PCT/JP13/060028 filed Apr. 2, 2013.

Office Action issued on Sep. 15, 2015 in the corresponding Korean Patent Application No. 10-2014-7026377 (with English Translation).

Extended European Search Report issued Dec. 22, 2015 in EP Patent Application No. 13776071.6 in English.

Office Action mailed Dec. 4, 2015 in Chinese Application No. 201380019119.7 (with partial English translation).

* cited by examiner

MAGNETIC SENSOR

TECHNICAL FIELD

The present disclosure relates to a magnetic sensor that detects a small magnetic pattern formed on a sheet-like medium such as paper currency.

BACKGROUND ART

A magnetic sensor is a sensor that uses a magnetoresistance element having a property in which the resistance varies according to magnetic field strength. The magnetization of a magnetic pattern included in a sheet-like medium such as paper currency is typically small. For this reason, particularly in a line-type magnetic sensor that detects multiple channels simultaneously, an anisotropic magnetoresistance element is often used in order to detect a magnetic pattern with high sensitivity. An anisotropic magnetoresistance element generally is more sensitive than a semiconductor magnetoresistance element. In a magnetic sensor, it is necessary to provide anisotropic magnetoresistance elements in areas of magnetic field strength where the sensitivity rises without any reaching magnetic saturation, and then convey a sheet-like medium such as paper currency through the strong magnetic field range.

However, in a magnetic sensor using an anisotropic magnetoresistance element, since an anisotropic magnetoresistance element saturates at a magnetic flux density of approximately 10 mT, it is difficult to dispose multiple anisotropic magnetoresistance elements in areas of magnetic field strength where the sensitivity rises without saturating.

In order to solve such a problem, Patent Literature 1 discloses a magnetic sensor in which a permanent magnet is disposed with the position adjusted so that the bias magnetic field strength in the magneto-sensing direction of ferromagnetic thin film magnetoresistance elements (anisotropic magnetoresistance elements) simultaneously imparted by a detecting magnetic field from the permanent magnet reaches a magnetic flux that is not greater than the saturation magnetic field.

The magnetic sensor in Patent Literature 1 disposes a magnetoresistance element between a magnet and the object of detection. Besides the above, there are magnetic sensors configured so that the object of detection is moved between a magnet and a magnetoresistance element (see Patent Literature 2, for example), or, configured so that a magnetoresistance element is disposed between two magnets, and the object of detection is moved between the magnetoresistance element and one of the magnets (see Patent Literature 3, for example). With the configuration that moves the object of detection between a magnet and a magnetoresistance element, sometimes a magnet and a magnetized body are disposed opposite each other, and a magnetoresistance element is disposed on the side of the magnetized body.

For example, in the magnetic sensor in Patent Literature 4, a permanent magnet and a magnetized yoke are disposed opposite each other with a travel space therebetween, with the permanent magnet disposed below and the magnetized yoke disposed above. The opposing magnetic pole face of the permanent magnet forms the same magnetic polarity. A magnetoresistance element constituting a voltage-dividing circuit is installed on the side of the opposing face of the magnetized yoke. A groove is formed in the opposing face of the magnetized yoke. Lines of magnetic force coming from the permanent magnet converge and enter the magnetic pole of the magnetized yoke, and by disposing the magnetoresistance element in this magnetic flux convergence area, the resolution at which an object may be detected is raised.

Also, in the magnetic sensor of Patent Literature 5, the magnetized yoke is disposed above the magnet. A magnetic leg portion of the magnetized yoke has shape magnetic anisotropy, which suppresses the spread of the magnetic flux of the magnet.

CITATION LIST

Patent Literature

Patent Literature 1: Unexamined Japanese Patent Application Kokai Publication No. 2008-145379
Patent Literature 2: Unexamined Japanese Patent Application Kokai Publication No. 2005-129009
Patent Literature 3: Unexamined Japanese Patent Application Kokai Publication No. 2001-21631
Patent Literature 4: Unexamined Japanese Patent Application Kokai Publication No. H06-231336
Patent Literature 5: Unexamined Japanese Patent Application Kokai Publication No. H07-210833

SUMMARY OF INVENTION

Technical Problem

The magnetic sensor described in Patent Literature 1 does not disclose a specific method of disposing the permanent magnet so that the bias magnetic field strength in the magneto-sensing direction of ferromagnetic thin film magnetoresistance elements reaches a magnetic flux that is not greater than the saturation magnetic field. In addition, although it is necessary to make a uniform bias magnetic field strength in the magneto-sensing direction applied to multiple ferromagnetic thin film magnetoresistance elements in order to output on multiple channels, the method thereof is not disclosed.

In order to improve sensitivity of detecting an object of detection in a contactless magnetic sensor, it is necessary to increase the magnetic strength of the bias magnet, and increase the magnetic field strength of the conveyance path along which the object of detection is conveyed while applying an appropriate bias magnetic field to an anisotropic magnetoresistance element. In the magnetic sensor of Patent Literature 1, since the object of detection passes farther away from the bias magnet than the anisotropic magnetoresistance element, the variation in the magnetic field strength due to the object of detection is small, and the output signals from the individual anisotropic magnetoresistance elements are small.

In the magnetic sensors of Patent Literature 2 to 5, there is large spatial variation in the magnetic field strength near the areas where the magnetoresistance elements are disposed. The magnetoresistance elements are disposed in an area of large variation in magnetic field strength in the magneto-sensing direction, and there is a narrow range in which an optimal bias magnetic field may be obtained, making adjustment difficult.

The present disclosure has been devised in light of circumstances such as the above, and takes as an object to detect the magnetic pattern of an object of detection consistently and with good sensitivity in a contactless state in which the object of detection having the magnetic pattern is separated from a magnetoresistance element by a minute distance.

Solution to Problem

In order to achieve the above object, a magnetic sensor according to the present disclosure is provided with a magnet, disposed on one face of a conveyance path of an object of detection, that includes a magnetic pole of designated length along the conveyance direction of the object of detection, and a magnetic body, disposed opposite the magnet along the conveyance direction with the conveyance path therebetween. The magnetic body generates a cross magnetic field that crosses the conveyance path formed between the magnetic body and the magnet. Also provided is a magnetoresistance element, disposed on the side of the magnetic body facing the conveyance path, and having magneto-sensing action in the conveyance direction.

Advantageous Effects of Invention

According to the present disclosure, fluctuations in the bias magnetic field strength in the magneto-sensing direction applied to an anisotropic magnetoresistance element are decreased, enabling the magnetic pattern of an object of detection to be detected consistently and with good sensitivity.

DESCRIPTION OF EMBODIMENTS

Figure 1:
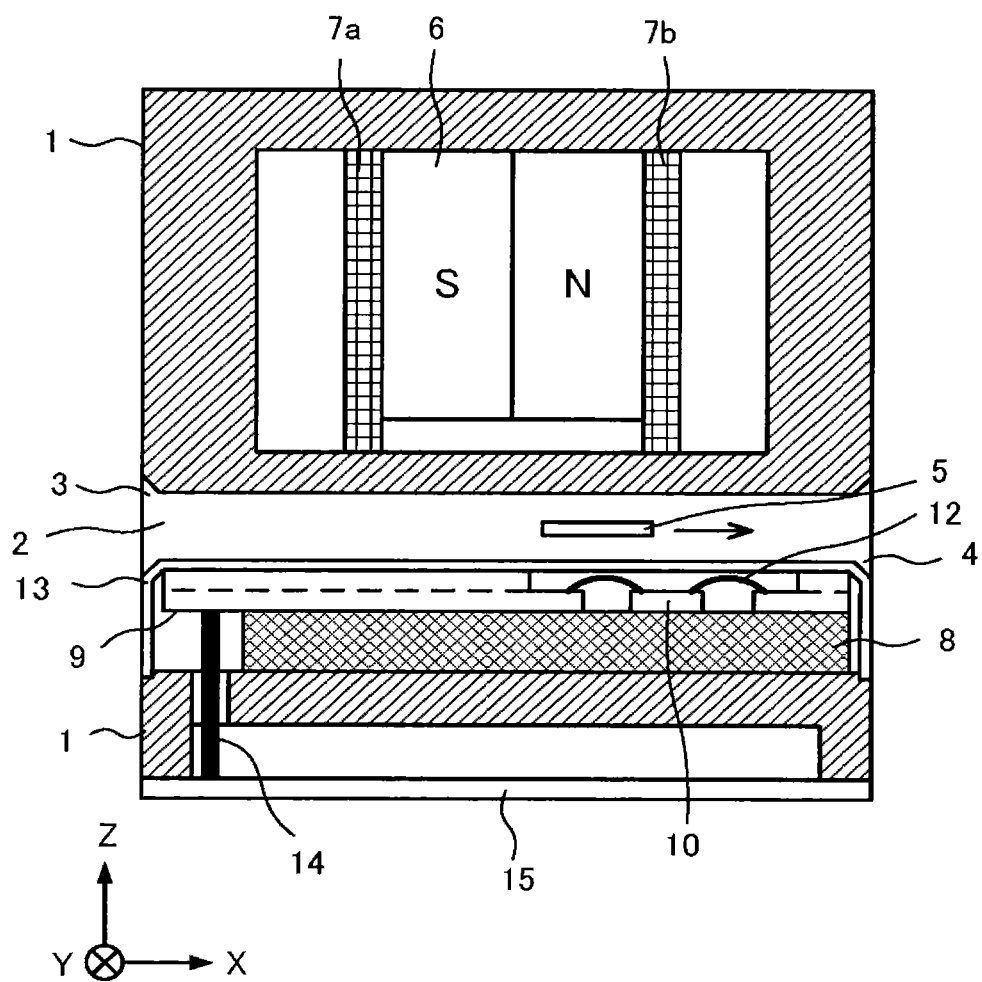
FIG. 1 is a planar cross-section view in the conveyance direction of an object of detection in a magnetic sensor according to Embodiment 1 of the present disclosure.

Hereinafter, embodiments of the present invention will be described with reference to the drawings. Note that in the drawings, the same signs are given to the same or corresponding parts.

Embodiment 1

Figure 2:
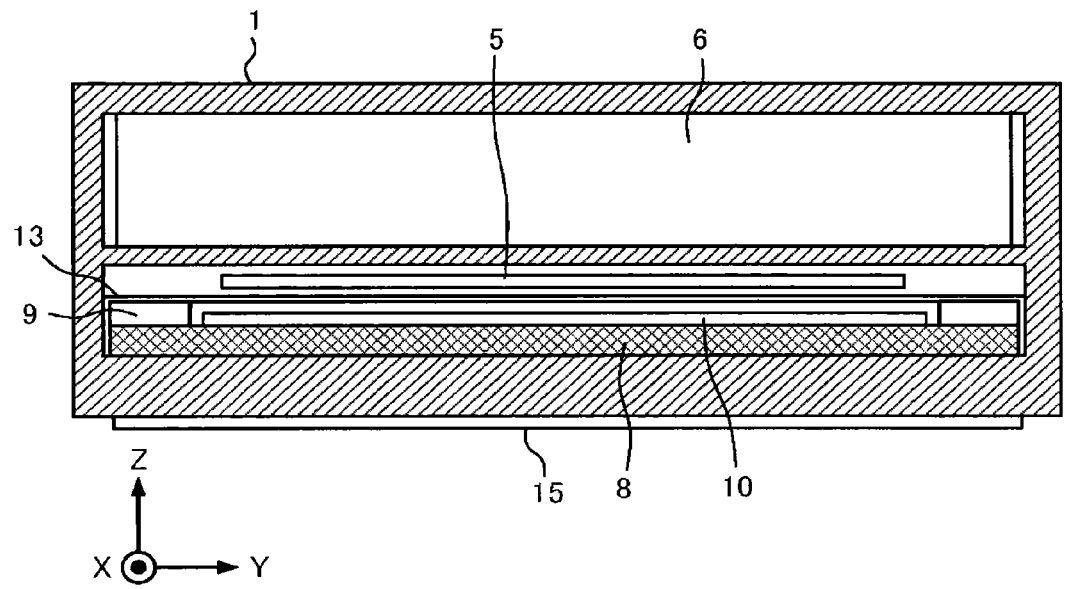
FIG. 2 is a cross-section view when viewing the magnetic sensor according to Embodiment 1 from the insertion/ejection direction of an object of detection.

FIG. 1 is a planar cross-section view in the conveyance direction of an object of detection in a magnetic sensor according to Embodiment 1 of the present disclosure. FIG. 2 is a cross-section view when viewing the magnetic sensor according to Embodiment 1 from the insertion/ejection direction of an object of detection. A hollow section 2 is formed inside a housing 1. A first slit section 3 is formed along the scanning width (the direction orthogonal to the conveyance direction of the object of detection) in one of the side faces (side walls) of the housing 1, and a second slit section 4 is formed parallel to the first slit section 3 in the other side face (side wall). The first slit section 3 and the second slit section 4 are connected via the hollow section 2. For example, an object of detection 5 containing a magnetic pattern to be detected is inserted from the first slit section 3, conveyed using the hollow section 2 as a conveyance path, and ejected from the second slit section 4.

A magnet 6 having an S pole and an N pole along the conveyance direction is disposed on one face in the conveyance direction in the hollow section 2, and is distanced from the object of detection 5 in the housing 1. A magnetic carrier 8 is disposed on the other face opposing the magnet 6 in the hollow section 2, and is distanced from the object of detection 5 in the housing 1. The magnetic carrier 8 is a soft magnetic body such as iron. Magnet yokes 7a and 7b, which make a pair for improving magnetic field uniformity, are disposed on both side faces of the magnet 6 in the conveyance direction. Assume that the conveyance direction of the object of detection 5 (for example, paper currency) is the X-axis direction, the scanning width direction of the conveyance path is the Y-axis direction, and the direction in which the magnet 6 and the magnetic carrier 8 oppose each other is the Z-axis direction.

An anisotropic magnetoresistance element (hereinafter designated an AMR element) 10 is disposed on the conveyance path side of the magnetic carrier 8, and is distanced from the object of detection 5. A substrate 9 surrounding the AMR element 10 and formed with a resin such as glass epoxy is placed on the magnetic carrier 8. The AMR element 10 is equipped with a resistor on a substrate surface such as silicon or glass, and has a property by which the resistance changes according to changes in the magnetic field orthogonal to the direction of current flowing in this resistor. The AMR element 10 is disposed so as to have magneto-sensing action in the conveyance direction of the object of detection 5.

The conveyance path side of the substrate 9 and the AMR element 10 is covered by an electric shield plate 13. The electric shield plate 13 transmits magnetic lines of force without being magnetized itself. A processing circuit 15 is disposed underneath the housing 1. The substrate 9 and the processing circuit 15 are connected by a cable 14.

Figure 3:
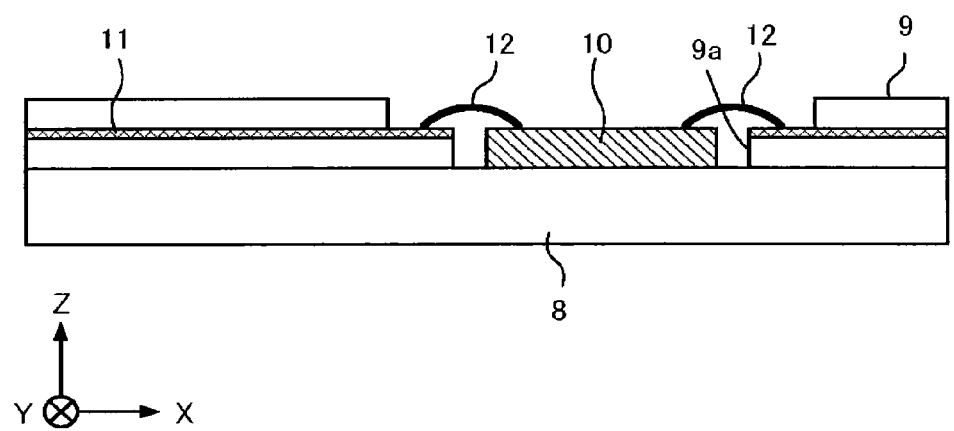
FIG. 3 is an enlarged view illustrating the mounted state of a substrate and an AMR element on a magnetic carrier in FIG. 1.
Figure 4:
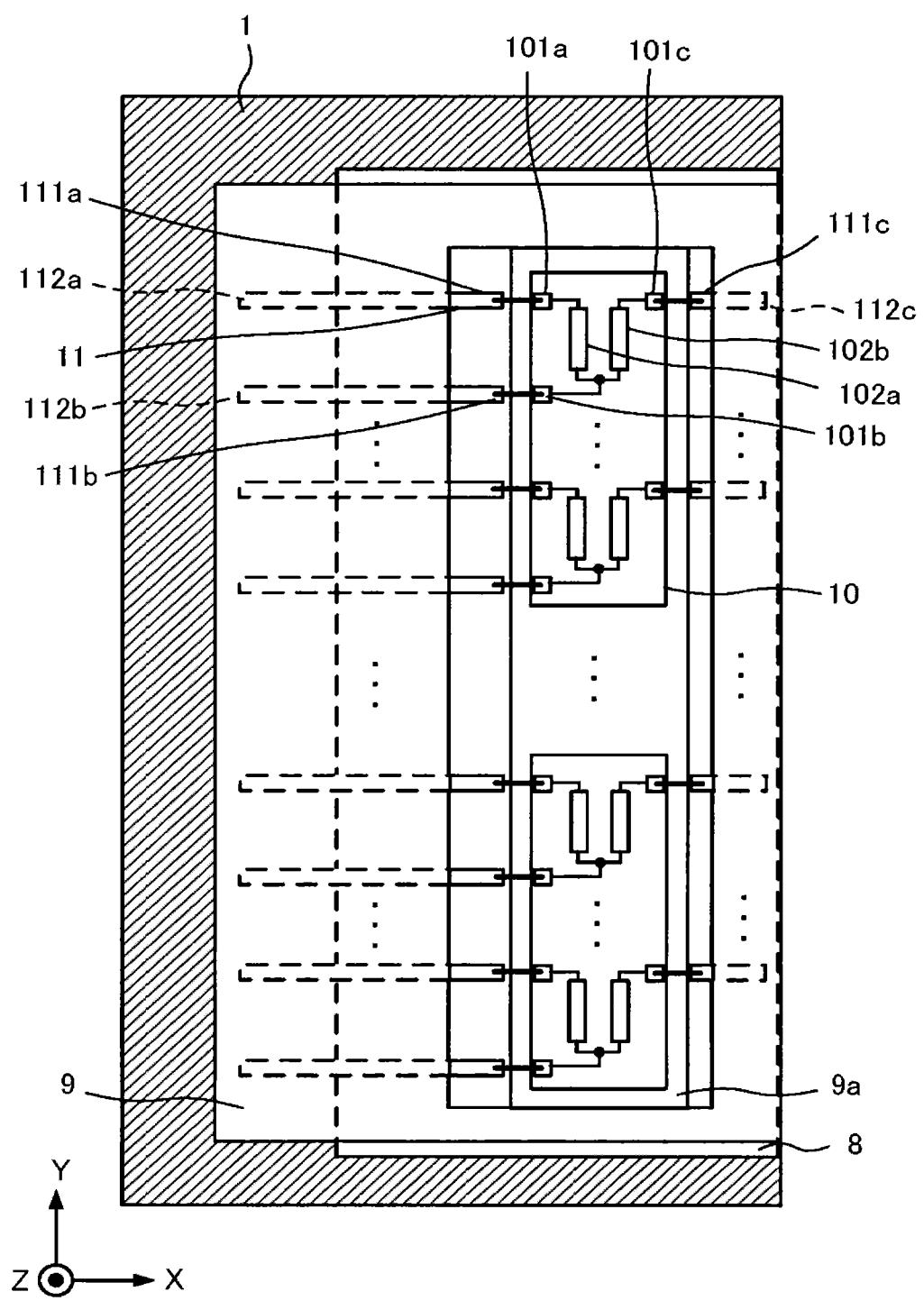
FIG. 4 is a top view illustrating the mounted state of an AMR element when viewing the substrate side from the hollow section in FIG. 1.

FIG. 3 is an enlarged view illustrating the mounted state of the substrate and the AMR element on the magnetic carrier in FIG. 1. FIG. 4 is a top view illustrating the mounted state of the AMR element when viewing the substrate side from the hollow section in FIG. 1. In FIGS. 3 and 4, the substrate 9 is affixed to the magnetic carrier 8. The substrate 9 includes a hole section 9a, and in the case of a large circuit scale, may also be configured as a multilayer substrate.

The AMR element 10 is affixed by an adhesive to the surface of the magnetic carrier 8 exposed by the hole section 9a, so as to be surrounded by the substrate 9. Electrodes 101a, 101b, and 101c of the AMR element 10 are respectively connected to electrodes 111a, 111b, and 111c provided on the substrate 9 by metal wires 12. The electrodes 111a, 111b, and 111c are respectively connected to external pads 112a, 112b, and 112c provided on a back face external to the substrate 9 via transmission lines 11. The external pads 112a, 112b, and 112c are connected to external circuits such as an amplifier circuit, a signal processing circuit, and a bias voltage. Note that the hole section 9a of the substrate may also be encapsulated with a resin or the like in order to protect the AMR element 10 and the metal wires 12.

In FIG. 4, resistor patterns 102a and 102b of the AMR element 10 are disposed in parallel so that the long edges of rectangular shapes extend in the scanning width direction (Y-axis direction). The adjacent resistor patterns 102a and 102b are connected in series, and this series connection is connected to the electrode 101b of the AMR element 10, while the other end of the resistor pattern 102a is connected to the electrode 101a, and the other end of the resistor pattern 102b is connected to the electrode 101c.

Figure 5:
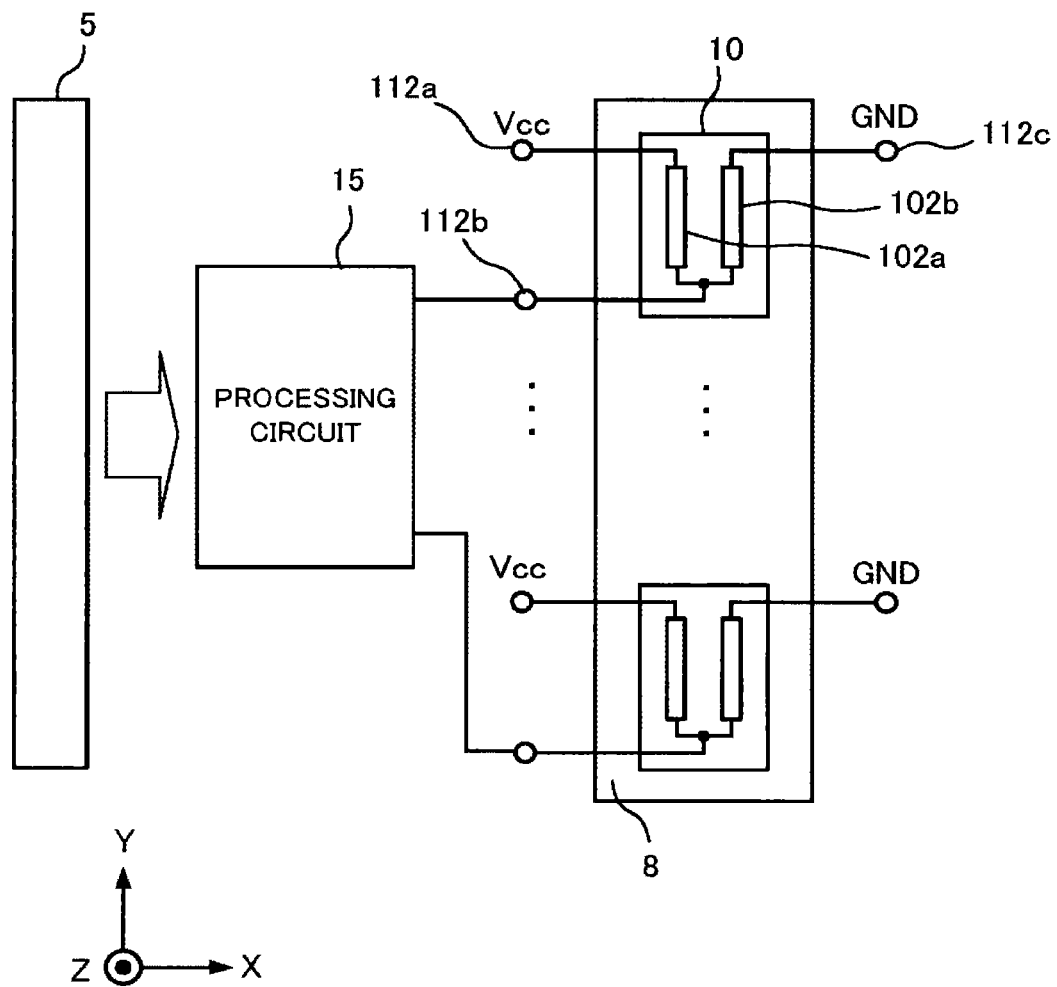
FIG. 5 is a connection diagram illustrating the connected state between an AMR element of the magnetic sensor according to Embodiment 1, and an external circuit.

FIG. 5 is a connection diagram illustrating the connected state between an AMR element of a magnetic sensor according to Embodiment 1, and an external circuit. The electrode 101a is connected to the electrode 111a by a metal wire 12 (electrical connecting means), and is connected to a DC power source voltage Vcc via the external pad 112a. The electrode 101b is connected to the electrode 111b by a metal wire 12, and is connected to a processing circuit 15 that processes a signal via the external pad 112b. The electrode 101c is connected to the electrode 111c by a metal wire 12, and is connected to DC ground (GND) via the external pad 112c.

Figure 6:
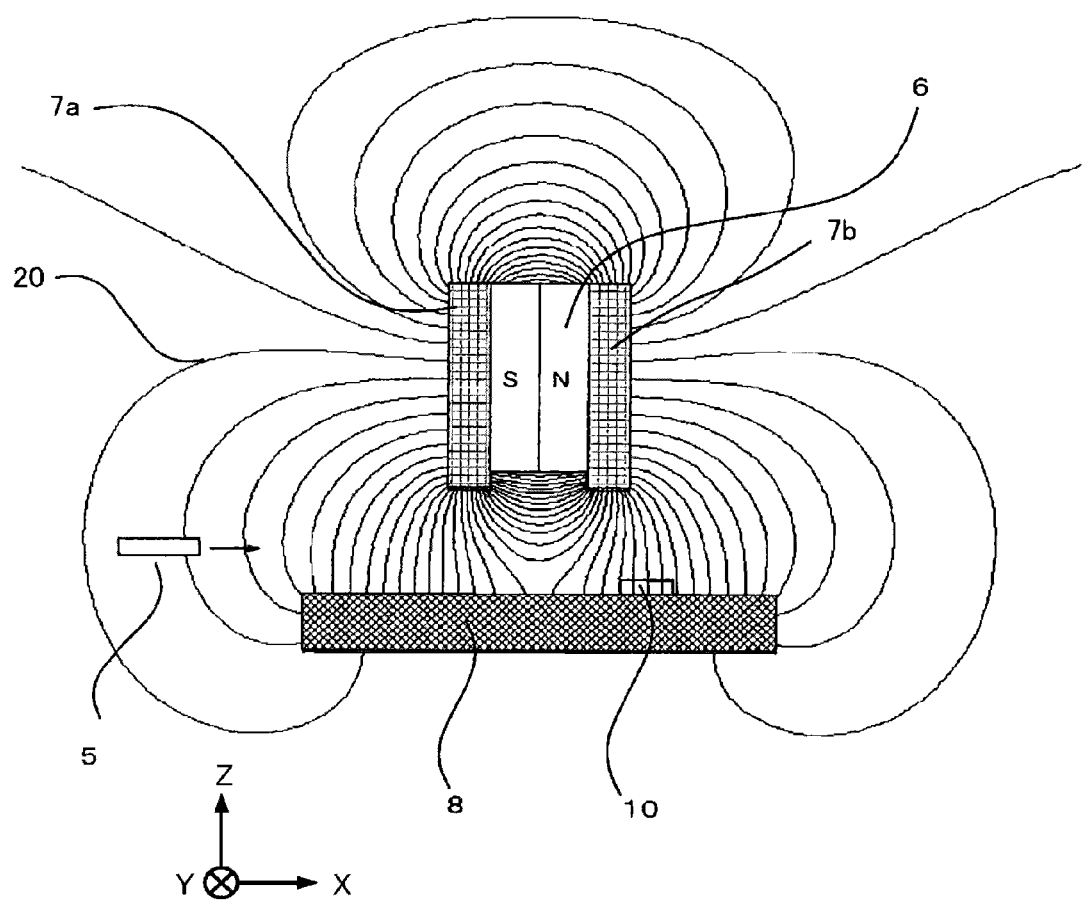
FIG. 6 is a diagram illustrating a magnetic figure generated from a magnet, yokes, and magnetic carrier in the magnetic sensor according to Embodiment 1.

FIG. 6 is a diagram illustrating a magnetic figure generated from a magnet, yokes, and magnetic carrier in the magnetic sensor according to Embodiment 1. Note that FIG. 6 depicts the structural elements from FIG. 1 that are relevant to explaining the magnetic figure, and omits other structural elements.

As illustrated in FIG. 6, because of the property of lines of magnetic force to be incident perpendicular to the magnetic pole face of a magnetic body (the Bz direction), near the surface of the magnetic carrier 8, the magnetic flux density component in the X-axis direction (Bx) is extremely small, and the magnetic flux density component (Bz) in the spacing direction (Z-axis direction) forms the primary component. The AMR element 10 is provided on the surface of the magnetic carrier 8, where Bx is extremely small while the magnetic flux density component (Bz) in the spacing direction (Z-axis direction) has a high magnetic field strength. The object of detection 5 passes through a position where the magnetic flux density (Bz) in the spacing direction has a high magnetic field strength, so as to cross the magnetic field in the spacing direction.

Preferably, the center of the AMR element 10 in the conveyance direction is offset forwards or backwards in the conveyance direction from the center of the magnet 6 in the conveyance direction. In addition, the center of the AMR element 10 in the conveyance direction is preferably disposed farther outward from the magnet 6 than the junction face between the magnet 6 and the yoke 7b. Also, the edge of the magnetic carrier 8 on the side where the AMR element 10 is disposed (the yoke 7b side) in the conveyance direction on the face opposing the magnet 6 and closest to the magnet 6 preferably extends past the range of the magnet 6 from the edge of the magnet 6 in the conveyance direction on the same side. Note that the edge on the side of the magnetic carrier 8 opposite to where the AMR element 10 is disposed (the yoke 7a side) may be within the range of the magnet 6.

Figure 7A:
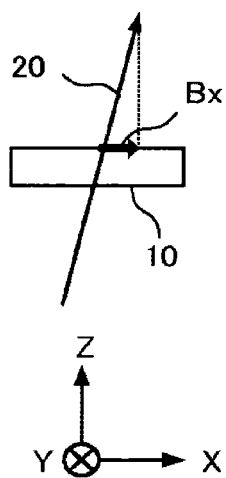
FIG. 7A is a magnetic line of force vector diagram explaining the detection principle of the magnetic sensor according to Embodiment 1.

In FIG. 6, near where the resistor patterns 102a and 102b of the anisotropic magnetoresistance element (AMR element) 10, the primary component of the line of magnetic force is a component that proceeds from the N pole of the magnet 6 to the magnetic carrier 8, and acts as a cross magnetic field crossing the conveyance path. Above the resistor patterns 102a and 102b, a line of magnetic force 20 is slightly tilted in the conveyance direction (X-axis direction) from the spacing direction (Z-axis direction), as illustrated in FIG. 7A. For this reason, the conveyance direction (X-axis direction) component of this magnetic field acts as a bias magnetic field on the AMR element 10.

Figure 7B:
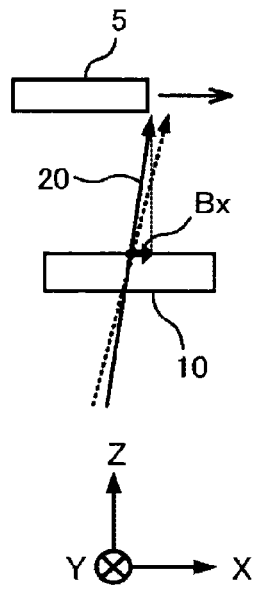
FIG. 7B is a magnetic line of force vector diagram when an object of detection approaches an AMR element.
Figure 7C:
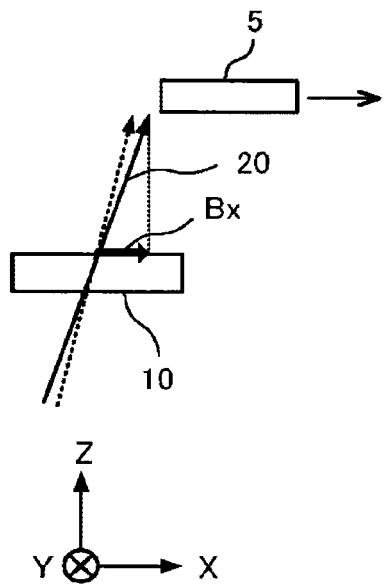
FIG. 7C is a magnetic line of force vector diagram when an object of detection moves away from an AMR element.

As illustrated in FIG. 7B, as the object of detection (paper currency) 5 including a magnetic pattern approaches the AMR element 10, the line of magnetic force 20 tilts towards the magnetic pattern, and thus the magnetic flux density (Bx) in the conveyance direction (X-axis direction) becomes smaller. As illustrated in FIG. 7C, as the object of detection (paper currency) 5 (magnetic pattern) moves away from the AMR element 10, the line of magnetic force 20 tilts towards the magnetic pattern, and thus the magnetic flux density (Bx) in the conveyance direction (X-axis direction) becomes larger. For this reason, the resistance of the AMR element 10 that magnetically senses the X-direction component changes, enabling sensing of the magnetic pattern.

Figure 8:
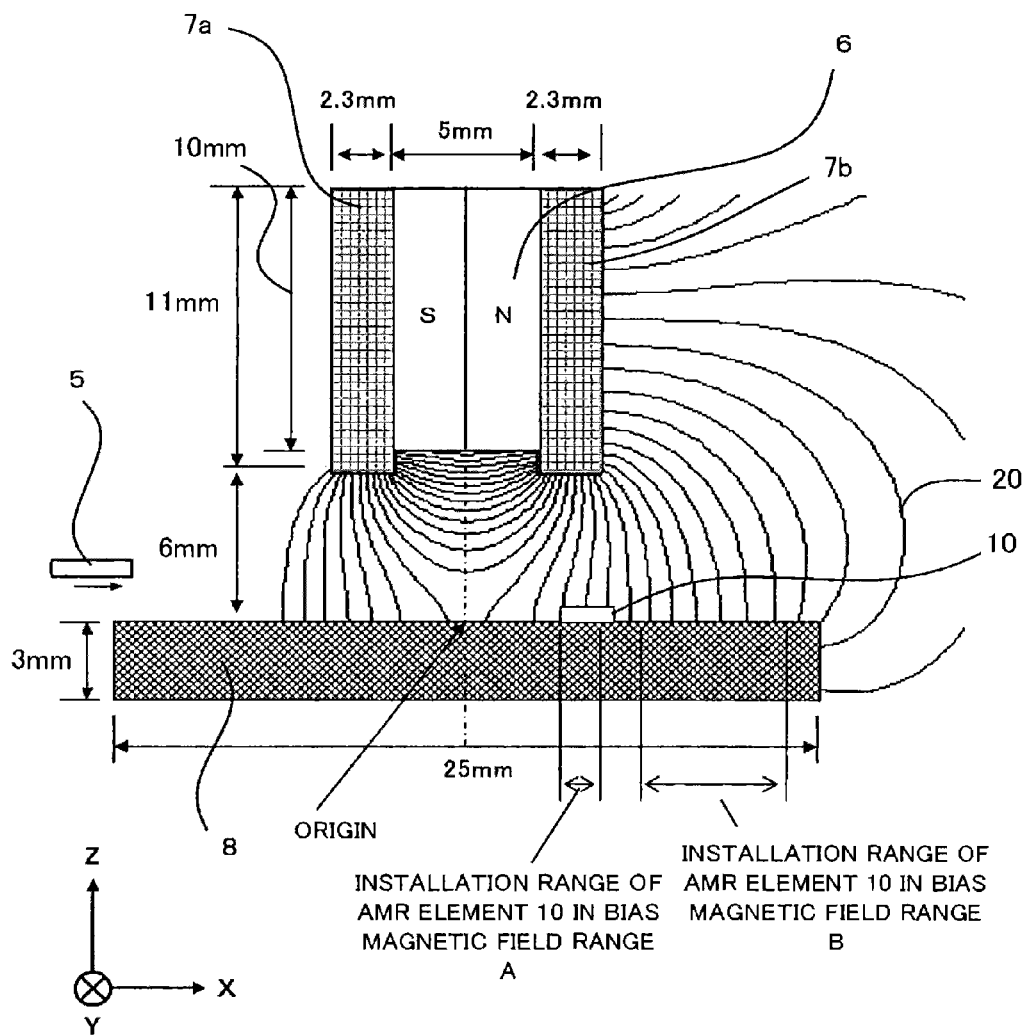
FIG. 8 is a diagram illustrating explaining a numerically calculated configuration in order to explain the detection principle of the magnetic sensor according to Embodiment 1.

FIG. 8 is a diagram illustrating explaining a numerically calculated configuration in order to explain the detection principle of the magnetic sensor according to Embodiment 1. Note that FIG. 8 depicts the structural elements from FIG. 1 that are relevant to explaining the magnetic figure, and omits other portions.

Figure 9:
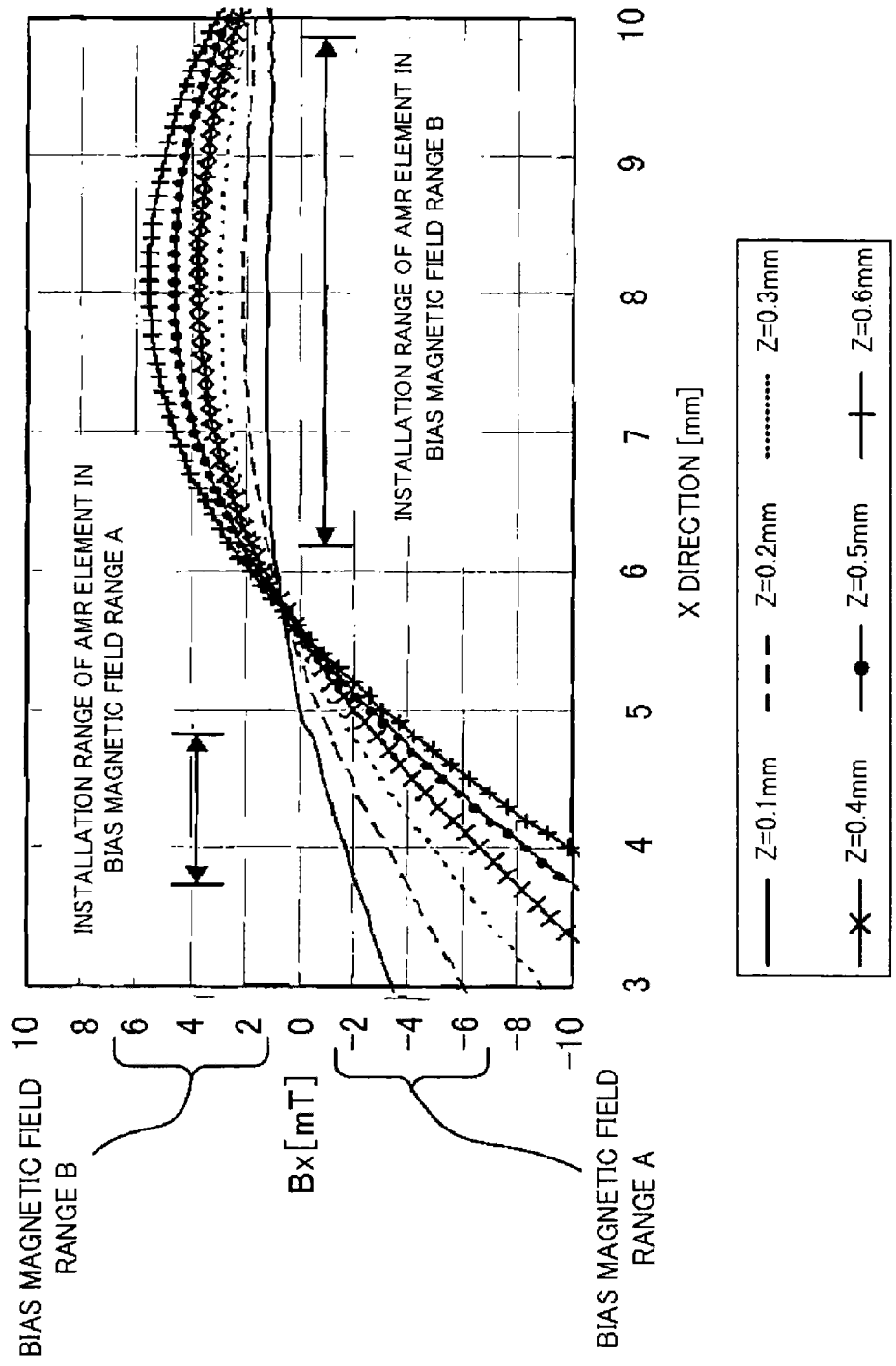
FIG. 9 is a diagram illustrating a distribution in the conveyance direction of the conveyance direction component of the magnetic flux density in the configuration of FIG. 8.

FIG. 9 is a diagram illustrating a distribution in the conveyance direction of the conveyance direction component of the magnetic flux density in the configuration of FIG. 8. The configuration of FIG. 8 illustrates the result of using a neodymium sintered magnet for the material of the magnet 6, and calculating the change in strength of the magnetic flux density in the X-axis direction (Bx) over the conveyance direction of the object of detection 5 (X-axis direction). In FIG. 9, the spacing direction (Z-axis direction) between the opposing magnet 6 and magnetic carrier 8 is varied between Z=0.1 mm to 0.6 mm as a parameter. Note that the origin of the X-axis direction is taken to be the center of the magnet 6, and the origin of the Z-axis direction is taken to be the surface of the magnetic carrier 8.

Figure 10:
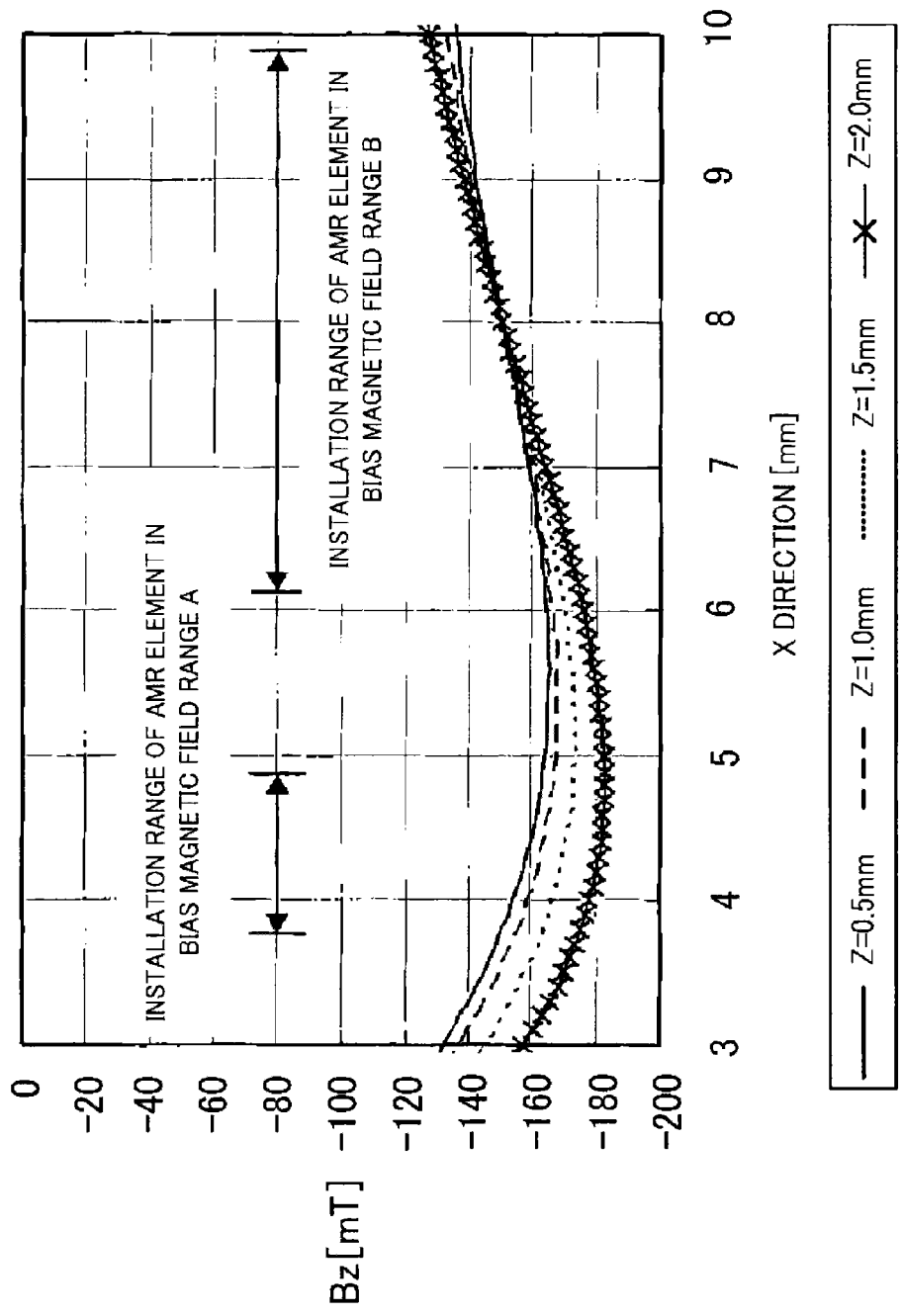
FIG. 10 is a diagram illustrating a distribution in the conveyance direction of the spacing direction component of the magnetic flux density in the configuration of FIG. 8.

FIG. 10 is a diagram illustrating a distribution in the conveyance direction of the spacing direction component of the magnetic flux density in the configuration of FIG. 8. The configuration of FIG. 8 illustrates the result of calculating the change in strength of the magnetic flux density in the Z-axis direction (Bz) over the conveyance direction of the object of detection 5 (X-axis direction). In FIG. 10, the spacing direction (Z-axis direction) between the opposing magnet 6 and magnetic carrier 8 is varied between Z=0.5 mm to 2 mm as a parameter. Note that the origin of the X-axis direction is taken to be the center of the magnet 6, and the origin of the Z-axis direction is taken to be the surface of the magnetic carrier 8.

Figure 11:
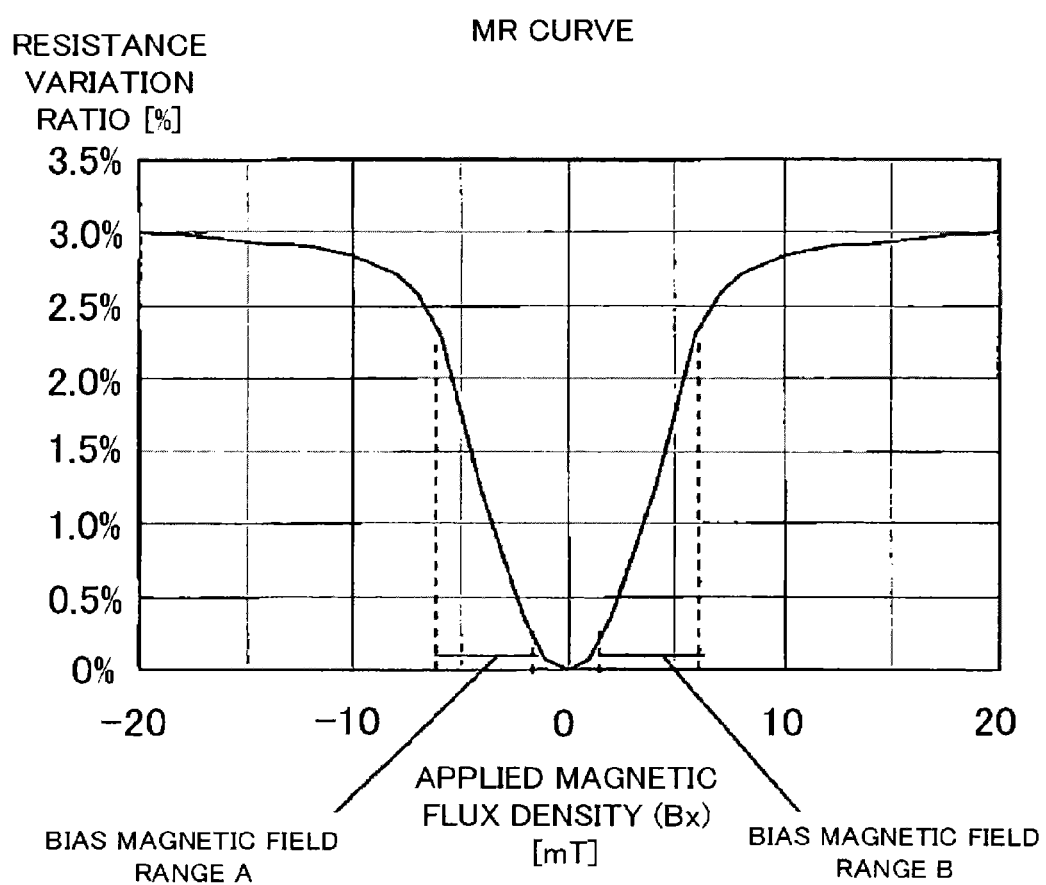
FIG. 11 is a diagram illustrating an example of the applied magnetic flux density and resistance variation ratio of an AMR element.

FIG. 11 is a diagram illustrating an example of the applied magnetic flux density and resistance variation ratio of an AMR element. In the case of using the AMR element 10 with a saturation magnetic flux density of 10 mT illustrated in FIG. 11 as the AMR element 10, a suitable sensitivity is obtained around a Bx of −2 to −6 mT (bias magnetic field range A) and around +2 to 6 mT (bias magnetic field B). For this reason, it is necessary to dispose the AMR element 10 so that each Bx applied to the resistor patterns 102a and 102b of the AMR element 10 is contained within the above bias magnetic field range A or bias magnetic field range B.

According to FIG. 9, in the case in which the thickness of the AMR element 10 is 0.3 mm (Z=0.3 mm), for example, it is sufficient to dispose the AMR element 10 at a position of X=3.7 mm to 4.8 mm in order for the Bx applied to the resistor patterns 102a and 102b to be contained in the bias magnetic field range A. It is possible to put the AMR element 10 in a bias magnetic field range with a very loose assembly precision of Δ1 mm or more. Particularly, in a line sensor in which multiple AMR elements 10 are disposed in the scanning width direction, fluctuations in bias magnetic field strength in the magneto-sensing direction of the respective AMR elements 10 are decreased, and the configuration is extremely effective at minimizing fluctuations across channels. Note that this advantageous effect enables looser assembly precision for not only the AMR element 10, but also the magnet 6 and the magnetic carrier 8.

In addition, change in the magnetic field when the object of detection 5 (magnetic pattern) is exerted on the resistor patterns 102a and 102b is proportional to the magnetic field near the object of detection 5 (the magnetic field applied to the object of detection 5). When detecting this change in the magnetic field with the AMR element 10, it is necessary to apply a larger magnetic field to the object of detection 5 in order to achieve higher output. In Embodiment 1, the magnetic flux density applied to the object of detection 5 is Bz=approx. 180 mT according to FIG. 10, and the magnetic pattern of the object of detection 5 is detected with good sensitivity even if the AMR element 10 and the object of detection 5 are separated.

According to the configuration of Embodiment 1, even if the magnetic strength of the magnet 6 is increased to achieve higher output, the Bx applied to the resistor patterns 102a and 102b of the AMR element 10 is small. For this reason, it is possible to obtain consistent output in a magnetic sensor without greatly worsening the assembly precision.

In addition, if the thickness of the AMR element 10 is made thinner, the Bx applied to the resistor patterns 102a and 102b becomes smaller, thus enabling stable usage of the AMR element 10 with higher sensitivity (that is, the slope in FIG. 11 becomes steeper), and making it possible to raise the sensitivity of the AMR element 10 in order to raise output.

Similarly, even in the case of using the bias magnetic field range B, in FIG. 9, if the thickness of the AMR element 10 is 0.3 mm (Z=0.3 mm), for example, it is sufficient to dispose the AMR element 10 at a position X=6.2 mm to 9.8 mm. At this point, the magnetic flux density applied to the object of detection 5 is Bz=approx. 130 mT to 170 mT according to FIG. 10. Compared to the bias magnetic field range A, the output lowers somewhat when the AMR element 10 and the object of detection 5 are separated, it is possible to detect the magnetic pattern of the object of detection 5 with good sensitivity and an extremely loose assembly precision of Δ3 mm or more.

In this way, since a strong magnetic field in the spacing direction (Z-axis direction) is applied to the object of detection 5, even if the AMR element 10 and the object of detection 5 are separated, the magnetic pattern of the object of detection 5 is detected with good sensitivity. In addition, since the bias magnetic field strength in the conveyance direction (X-axis direction) applied to the resistor patterns 102a and 102b of the AMR element 10 varies slightly across positions in the X-axis direction, the assembly tolerance for a fixed sensitivity requirement broadens, and inconsistencies in sensitivity are reduced. Furthermore, by making the thickness of the AMR element 10 thinner, the magnetic strength of the magnet 6 may be increased in order to improve output. Also, consistent output over multiple channels is obtained, even if the sensitivity of the AMR element 10 is raised. Furthermore, since the magnet 6 and the magnetic carrier 8 are disposed opposite each other, a stable magnetic path is formed, and the magnetic pattern of the object of detection 5 is consistently detected while being resistant to the effects of external magnetic bodies.

Figure 12:
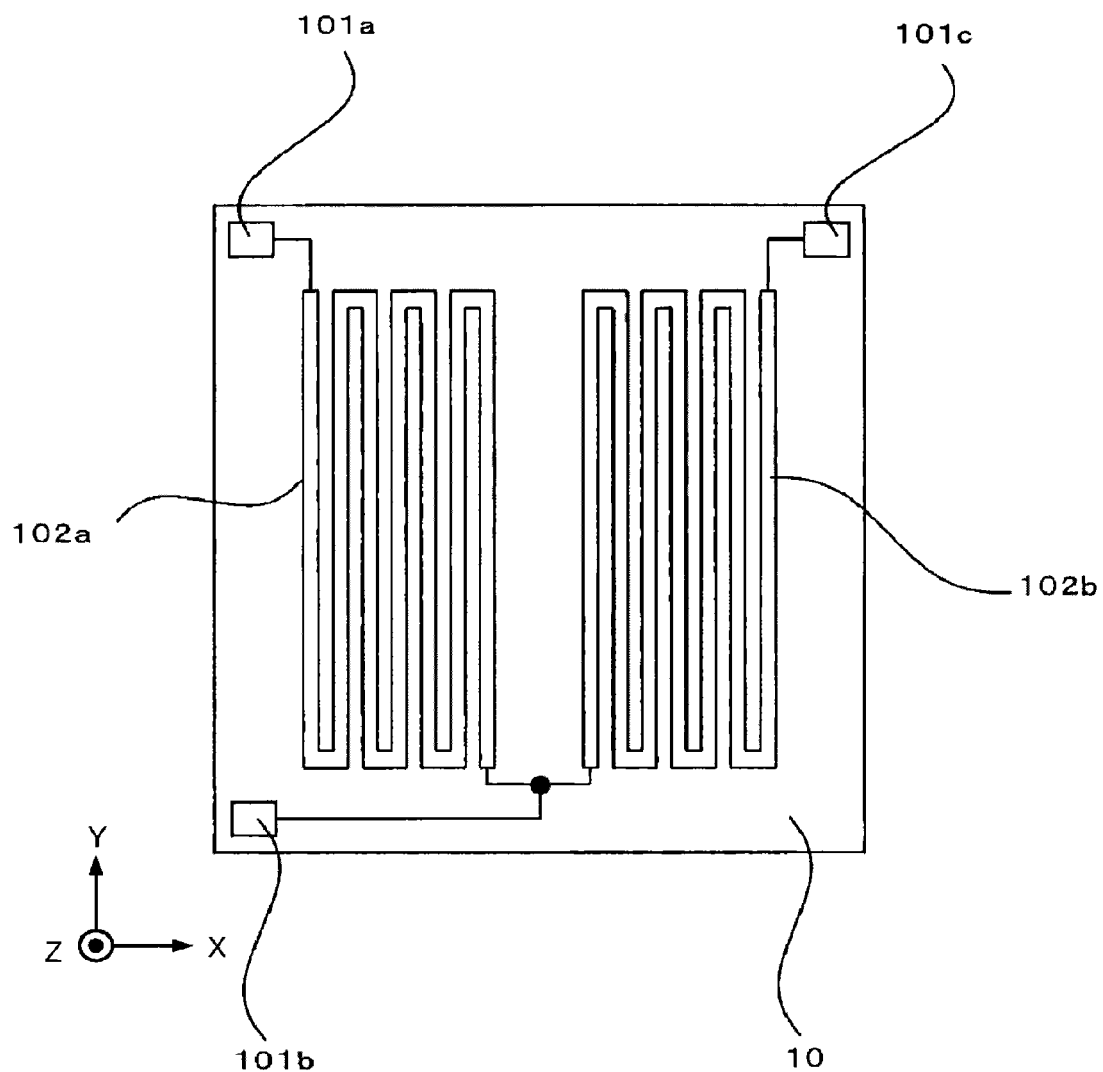
FIG. 12 is a top view of an AMR element having a meandering resistance pattern.

FIG. 12 is a top view of an AMR element having a meandering resistance pattern. In FIG. 4, the resistor patterns 102a and 102b of the AMR element 10 are rectangular shapes, but as illustrated in FIG. 12, may also be meandering shapes disposed so that the long edges extend in the scanning width direction (Y-axis direction). In this case, the resistance values of the resistor patterns 102a and 102b increase and become higher resistance values than those of the rectangular shapes, thereby improving the sensitivity of the AMR element 10 for detecting change in the magnetic field, and increasing the detection sensitivity of the magnetic sensor.

Figure 13:
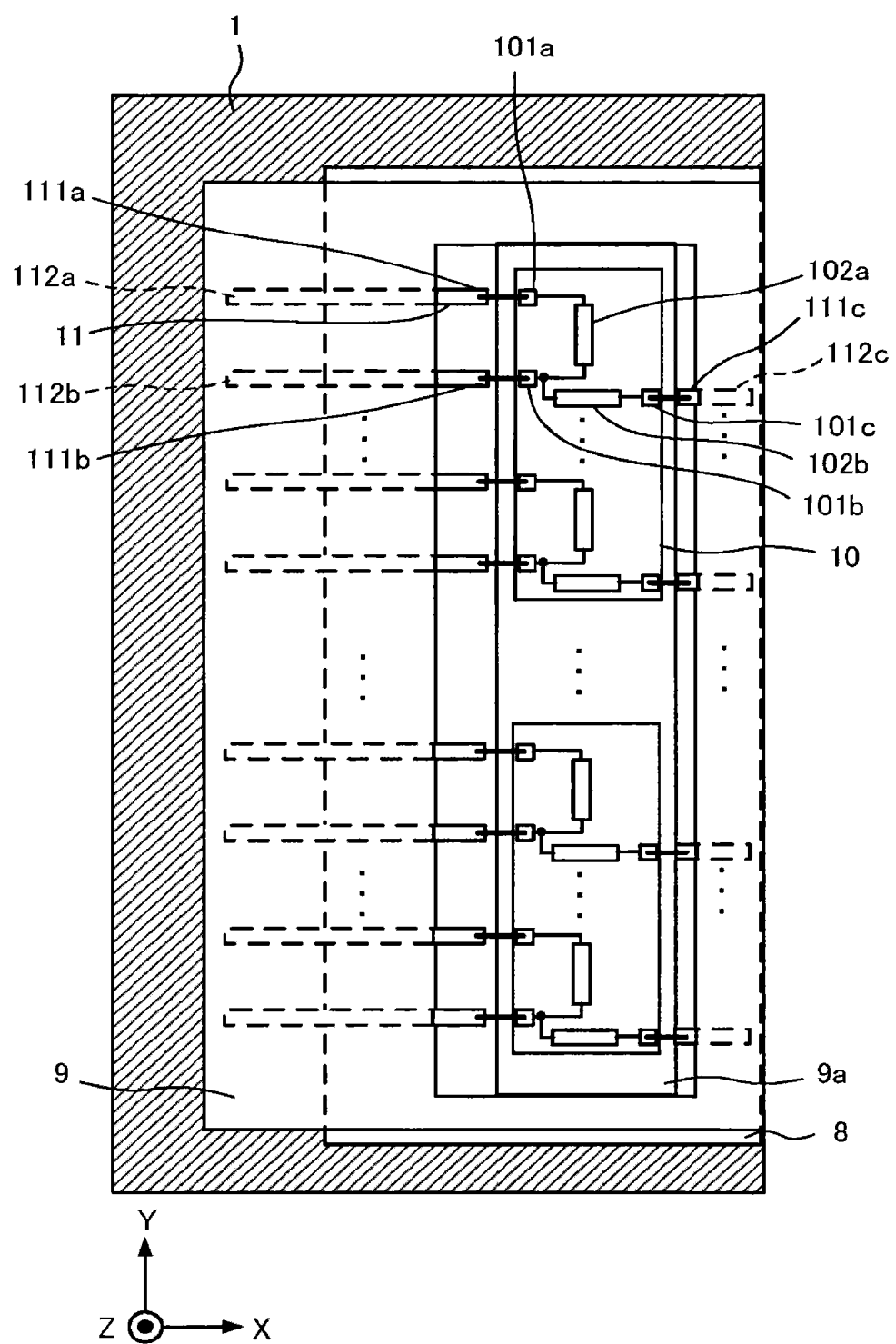
FIG. 13 is a top view illustrating the mounted state in the case modifying the magnetic resistance pattern to a T-shaped configuration.
Figure 14:
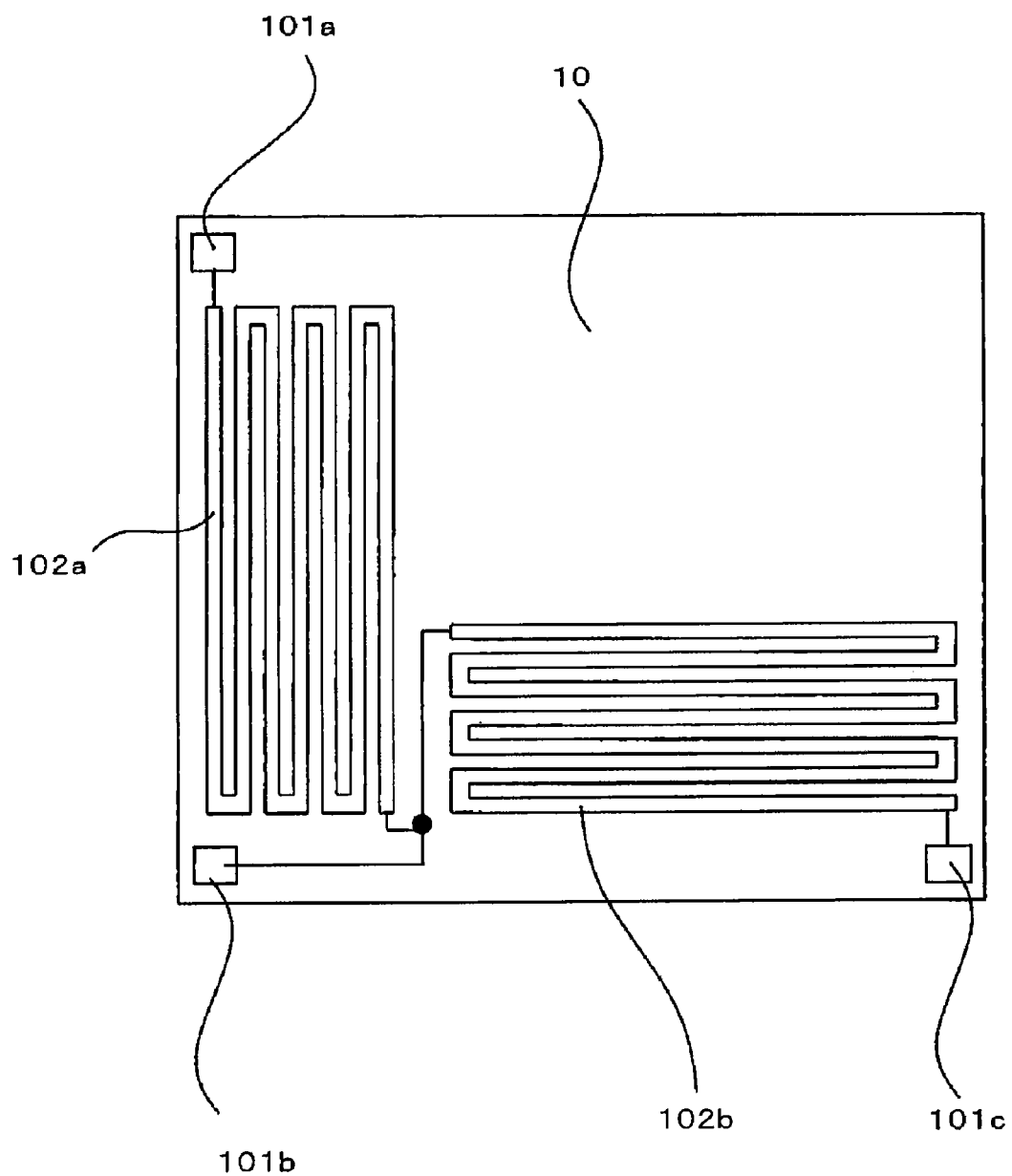
FIG. 14 is a top view of the AMR element having a meandering resistance pattern in FIG. 13.

FIG. 13 is a top view illustrating the mounted state in the case modifying the magnetic resistance pattern to a T-shaped configuration. The arrangement of the resistor patterns 102a and 102b of the AMR element 10 may also be a vertical arrangement as illustrated in FIG. 13. Also, even in the case of this arrangement, the resistor patterns 102a and 102b may have a meandering shape as illustrated in FIG. 14.

In Embodiment 1, the magnet 6 is configured to have a pair of yokes 7a and 7b disposed in order to improve the magnetic field uniformity at either side face in the conveyance direction, but the yokes 7a and 7b may also be omitted.

Additionally, although the magnet 6 is disposed in an S pole, N pole order from the first slit section 3 along the conveyance direction of the object of detection 5, the magnet 6 may also be disposed as N pole, S pole.

Note that in Embodiment 1, although an AMR element 10 is used as a magnetoresistance element, a giant magnetoresistance (GMR) element or a tunneling magnetoresistance (TMR) element may also be used.

Embodiment 2

Figure 15:
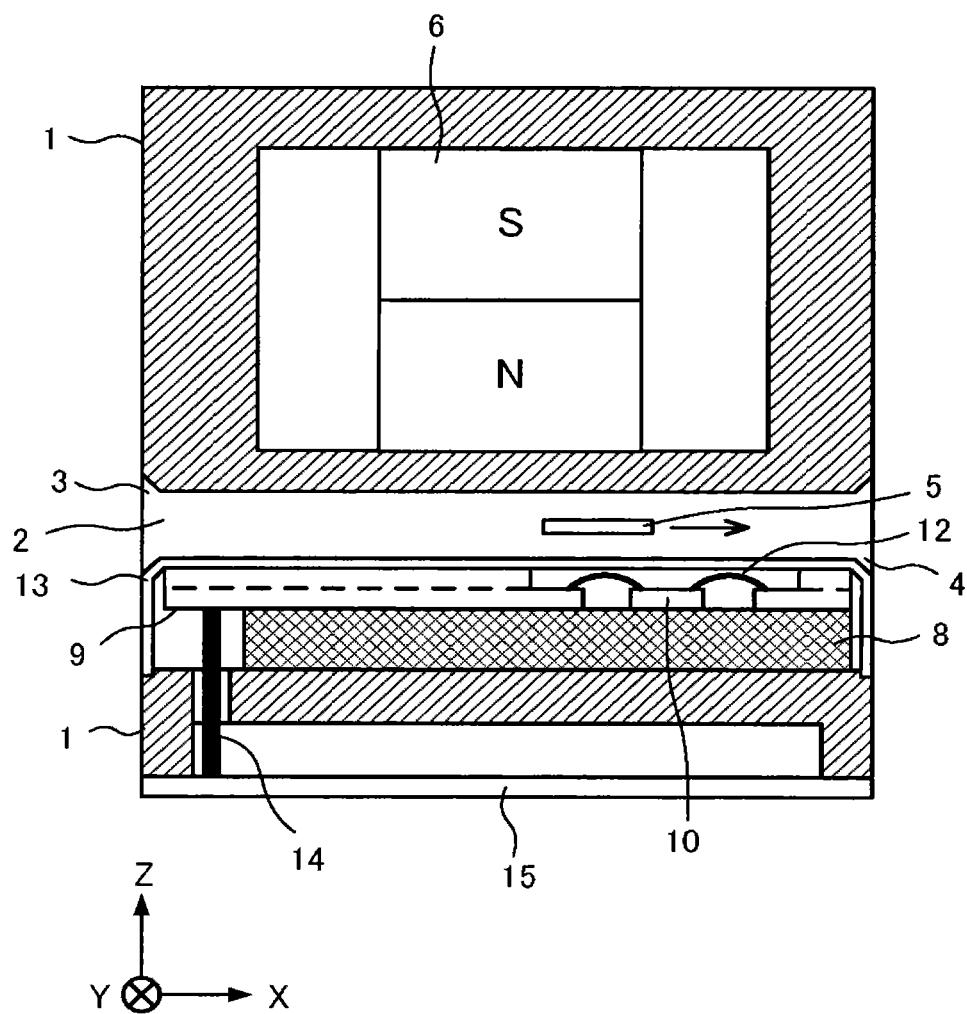
FIG. 15 is a planar cross-section view in the conveyance direction of an object of detection in a magnetic sensor according to Embodiment 2 of the present disclosure.

FIG. 15 is a planar cross-section view in the conveyance direction of an object of detection in a magnetic sensor according to Embodiment 2 of the present disclosure. Embodiment 1 describes a configuration in which the magnet 6 is disposed having S pole, N pole along the conveyance direction of the object of detection 5. In Embodiment 2, one of the magnetic poles along the conveyance direction (in FIG. 15, the N pole) is disposed on the conveyance path side.

Even with the arrangement of the magnet 6 in FIG. 15, a magnetic field is formed in the Z direction between the magnet 6 and the magnetic carrier, and thus operational advantages similar to Embodiment 1 of the present disclosure are obtained.

Embodiment 3

Figure 16:
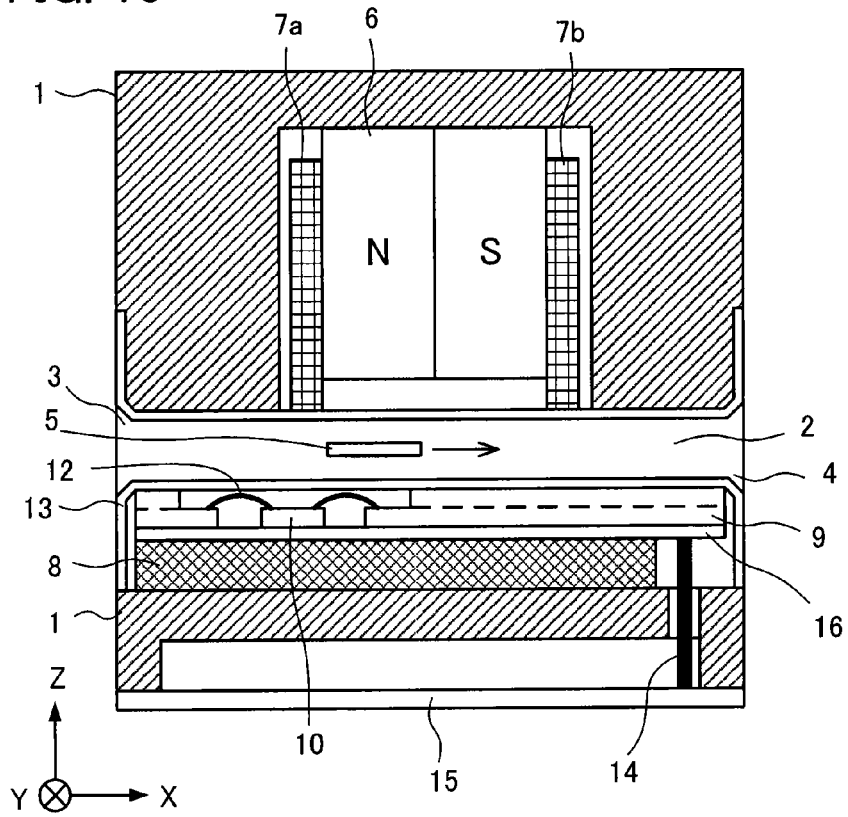
FIG. 16 is a planar cross-section view in the conveyance direction of an object of detection in a magnetic sensor according to Embodiment 3 of the present disclosure.
Figure 17:
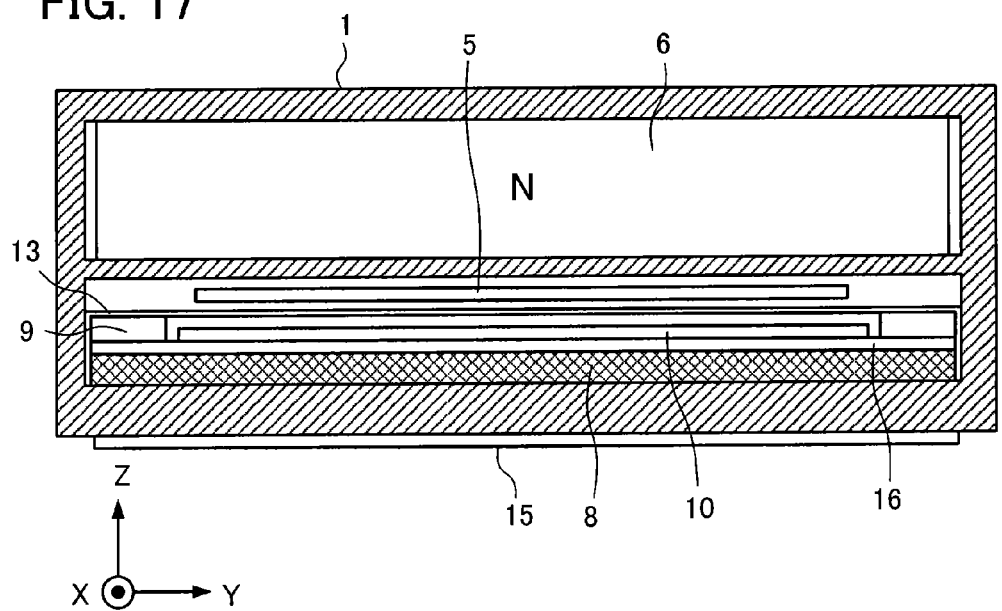
FIG. 17 is a cross-section view of the magnetic sensor according to Embodiment 3 as viewed from the insertion/ejection direction of an object of detection.

FIG. 16 is a planar cross-section view in the conveyance direction of an object of detection in a magnetic sensor according to Embodiment 3 of the present disclosure. FIG. 17 is a cross-section view of the magnetic sensor according to Embodiment 3 as viewed from the insertion/ejection direction of an object of detection. A hollow section 2 is formed inside the housing 1. A first slit section 3 is formed along the scanning width (the direction orthogonal to the conveyance direction of the object of detection) in one of the side faces (side walls) of the housing 1, and a second slit section 4 is formed parallel to the first slit section 3 in the other side face (side wall). The first slit section 3 and the second slit section 4 are connected via the hollow section 2. For example, an object of detection 5 containing a magnetic pattern to be detected is inserted from the first slit section 3, conveyed using the hollow section 2 as a conveyance path, and ejected from the second slit section 4.

A magnet 6 having an S pole and an N pole along the conveyance direction is installed on one face in the conveyance direction in the hollow section 2, and is distanced from the object of detection 5 in the housing 1. A magnetic carrier 8 is installed on the other face opposing the magnet 6 in the hollow section 2, and is distanced from the object of detection 5 in the housing 1. The magnetic carrier 8 is a soft magnetic body such as iron. Yokes 7a and 7b, which make a pair for improving magnetic field uniformity, are installed on both side faces of the magnet 6 in the conveyance direction. The magnetic carrier 8 extends farther outward than the yokes 7a and 7b along the conveyance direction.

A non-magnetic carrier 16 is provided on the surface of the magnetic carrier 8 on the conveyance path side, separated from the object of detection 5. An anisotropic magnetoresistance element (hereinafter designated an AMR element) 10 is disposed on the non-magnetic carrier 16. A substrate 9 surrounding the AMR element 10 and formed with a resin such as glass epoxy is placed on the non-magnetic carrier 16. The AMR element 10 is equipped with a resistor on a substrate surface such as silicon or glass, and has a property by which the resistance changes according to changes in the magnetic field orthogonal to the direction of current flowing in this resistor.

The conveyance path side of the magnet 6 and yokes 7a and 7b, as well as the conveyance path side of the substrate 9 and the AMR element 10, are respectively covered by an electric shield plate 13. The electric shield plate 13 transmits magnetic lines of force without being magnetized itself. A processing circuit 15 is disposed underneath the housing 1. The substrate 9 and the processing circuit 15 are connected by a cable 14.

Figure 18:
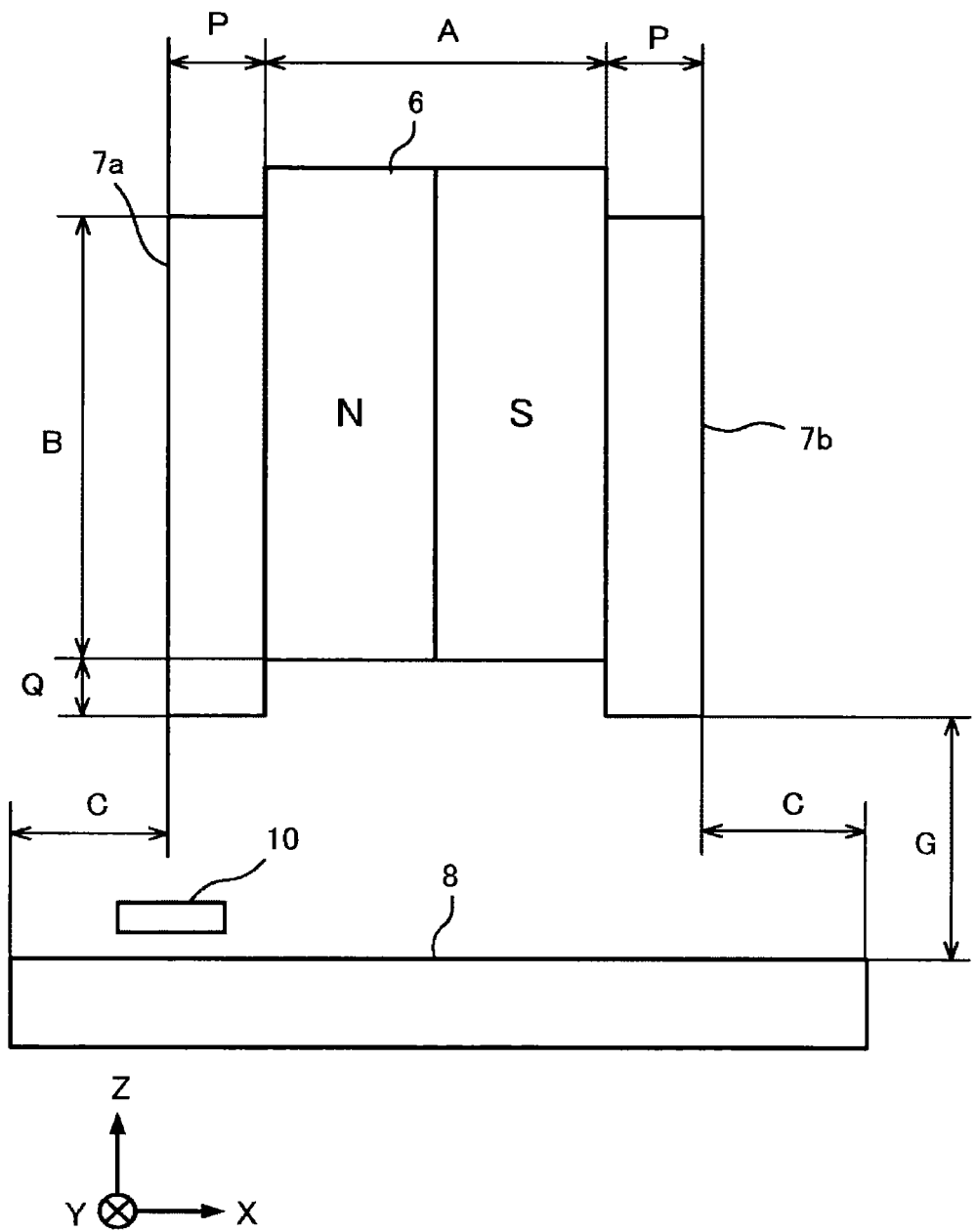
FIG. 18 is a diagram illustrating the arrangement of components constituting a magnetic circuit in the magnetic sensor according to Embodiment 3.

FIG. 18 is a diagram illustrating the arrangement of components constituting a magnetic circuit in the magnetic sensor according to Embodiment 3. FIG. 18 depicts only the structural elements that are relevant to explaining the operation in FIG. 16, and omits other structural elements. The AMR element 10 is separated from the magnetic carrier 8 by a distance equal to the thickness of the non-magnetic carrier 16.

Figure 19:
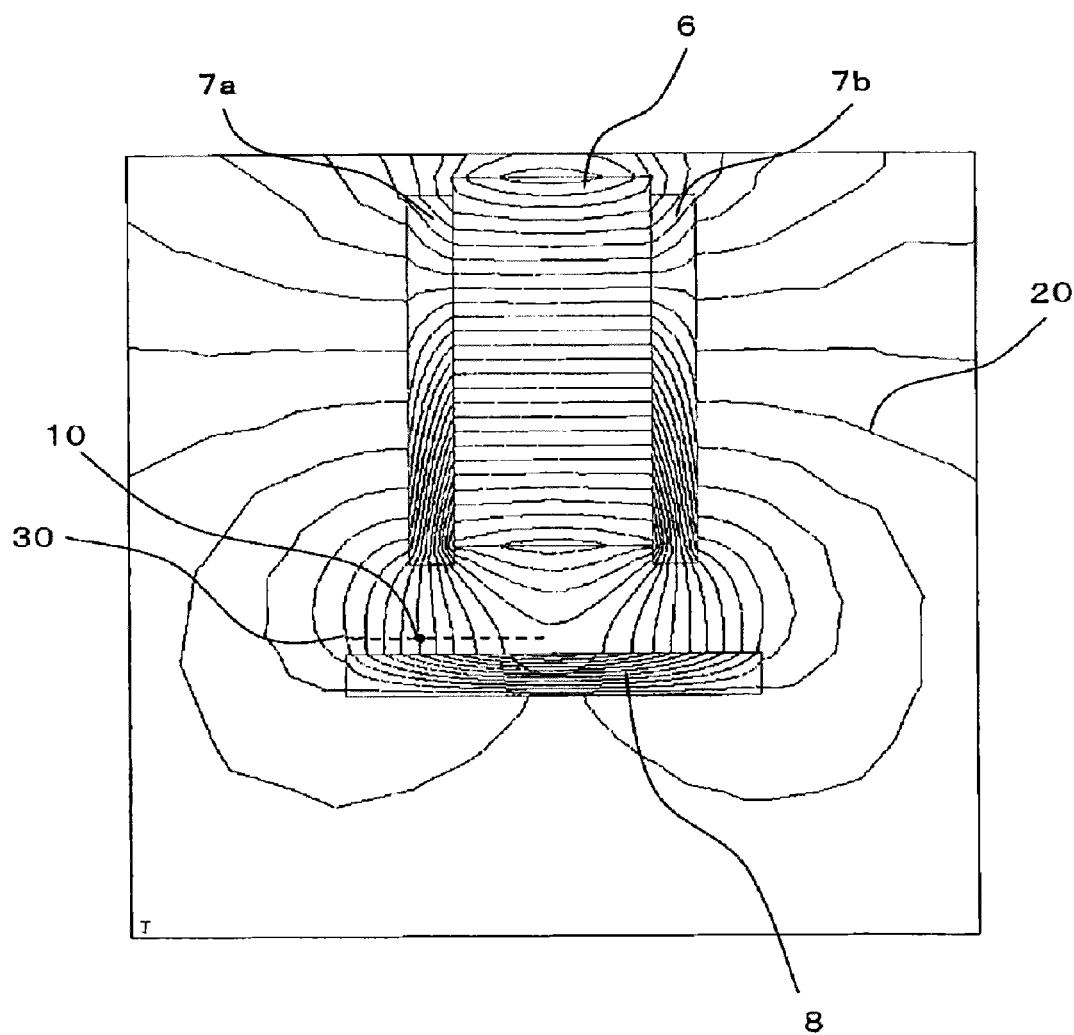
FIG. 19 is a diagram illustrating a magnetic figure in the configuration of FIG. 18.

FIG. 19 is a diagram illustrating a magnetic figure in the configuration of FIG. 18. Magnetic lines of force are distributed such that magnetic lines of force from the yokes 7a and 7b are concentrated in the magnetic carrier 8. The dashed line 30 indicates the position of the AMR element 10 with respect to the magnetic carrier 8. The height from the surface of the magnetic carrier 8 to the AMR element 10 is approximately 0.4 mm, for example. The AMR element 10 is disposed on this dashed line 30 at a position farther outward from the magnet 6 than the junction between the yoke 7a and the magnet 6.

In Embodiment 1, the AMR element 10 is disposed on the ejection side of the conveyance path from the center of the magnet 6 in the conveyance direction. In contrast, in Embodiment 3, the AMR element 10 is disposed on the insertion side of the conveyance path from the center of the magnet 6 in the conveyance direction. Since the magnet 6 is symmetrical about the center of the conveyance direction, the AMR element 10 may be placed on either of the insertion side and the ejection side of the conveyance path with respect to the magnet 6.

The AMR element 10 is disposed on the dashed line 30 at a position farther outward from the magnet 6 than the junction between the yoke 7a and the magnet 6, and is placed inside the magnetic field formed by the magnet 6, the yokes 7a and 7b, and the magnetic carrier 8. For example, if a magnetic pattern formed on an object of detection, such as an object of detection 5 on which is applied ink that contains a magnetic material, passes through this magnetic field, the magnetic field distribution changes, and the magnetic field being applied to the anisotropic magnetoresistance element 10 changes. Consequently, this change may be electrically sensed as a change in resistance.

Figure 20:
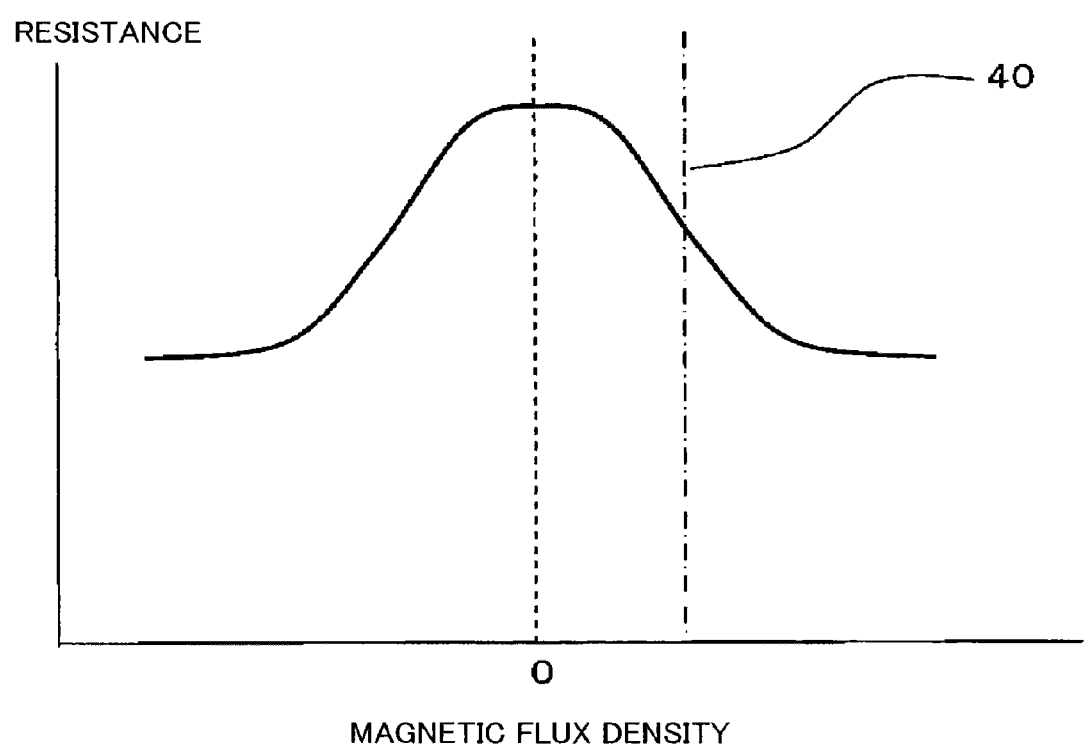
FIG. 20 is a diagram illustrating the relationship between the magnetic flux density applied to a magnetoresistance element and the resistance of the magnetoresistance element.

FIG. 20 is a diagram illustrating the relationship between the magnetic flux density applied to a magnetoresistance element and the resistance of the magnetoresistance element. In FIG. 20, if the magnetic flux density is increased or decreased from a state of 0 magnetic flux density, the resistance of the AMR element 10 changes, and the resistance becomes nearly constant when the magnetic flux density is equal to or greater than, or less than or equal to, certain values. This state in which the absolute value of the magnetic flux density becomes large and the resistance becomes nearly constant is called saturation. In the case in which the change in the magnetic flux density attempted to be measured using the magnetoresistance element is small versus the magnitude of the magnetic flux density reached when the magnetoresistance is in a saturated state, if a DC magnetic flux density with a magnitude indicated by the chain line 40 in FIG. 20 is applied, for example, the change in resistance due to the change in the magnetic flux density attempted to be measured will increase, making it possible to obtain a large electrical signal. A magnetic field that applies DC magnetic flux density as indicated by the chain line 40 is called a bias magnetic field.

As the magnetic figure illustrated in FIG. 19 demonstrates, since the lines of magnetic force 20 are incident perpendicular to the magnetic carrier 8, for the AMR element 10 located at a place slightly distanced from the magnetic carrier 8, the X-axis direction component of the magnetic flux density (hereinafter denoted Bx) becomes very small. Since the Bx bias magnetic field required by the AMR element 10 is small, a suitable Bx bias magnetic field is obtained by placing the AMR element 10 at a place approximately 0.4 mm away from the magnetic carrier 8. For the bias magnetic field to be applied to the AMR element 10, an absolute value of approximately 2±0.5 mT is suitable, for example.

Figure 21:
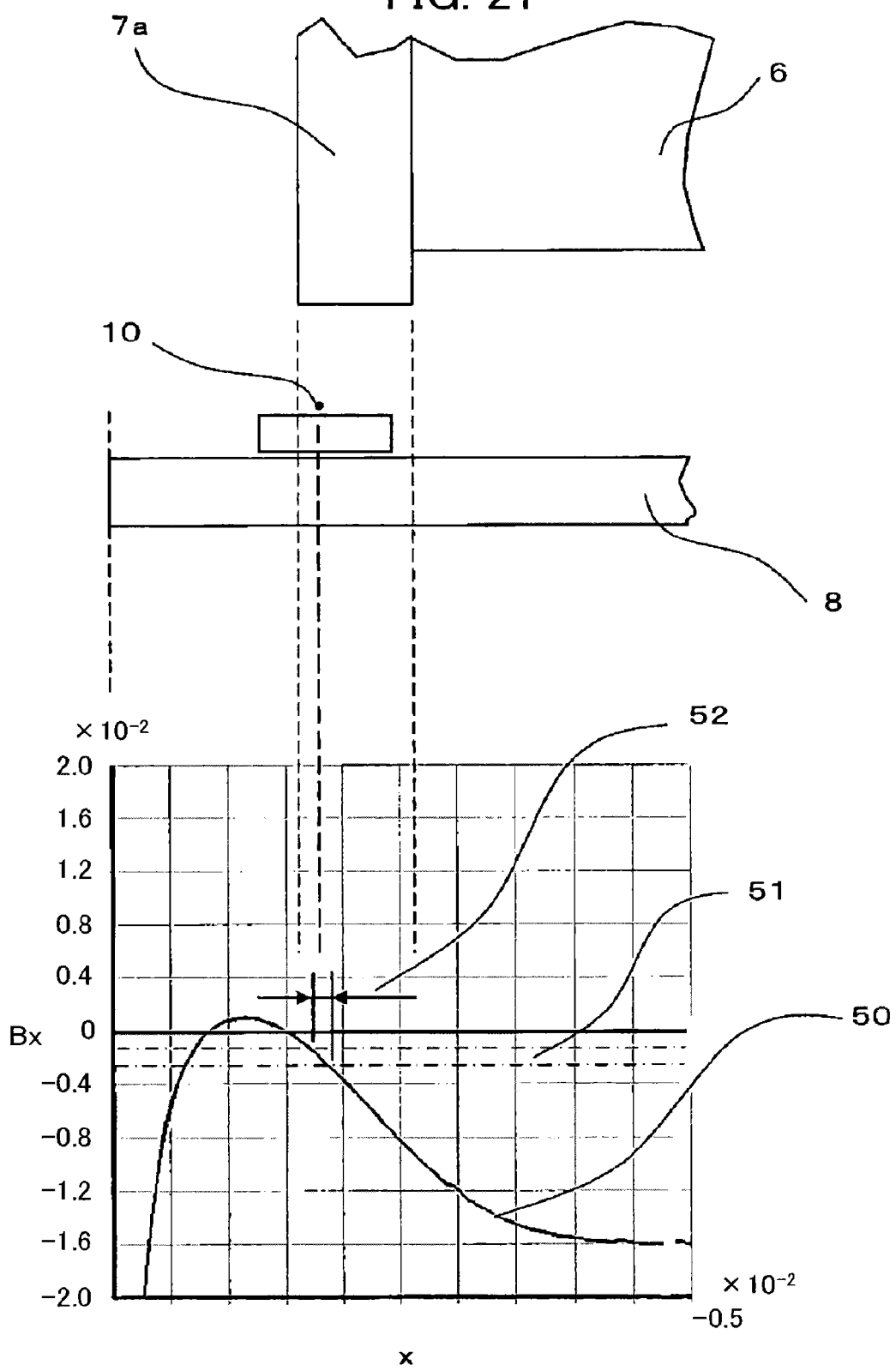
FIG. 21 is a diagram illustrating a distribution in the conveyance direction of the conveyance direction component of the magnetic flux density in the configuration of FIG. 18.

FIG. 21 is a diagram illustrating a distribution in the conveyance direction of the conveyance direction component of the magnetic flux density in the configuration of FIG. 18. FIG. 21 is a distribution of Bx on the dashed line 30 in FIG. 19, and is a distribution of Bx when A=10 mm, P=2.3 mm, B=19 mm, Q=1 mm, C=3.2 mm, and G=4.9 mm in FIG. 18. In FIG. 21, the horizontal axis is the distance (m) when treating the left edge of the magnetic carrier 8 as x=0, while the vertical axis is the conveyance direction component of the magnetic flux density (T). The distribution of Bx is indicated by the curve 50. In FIG. 21, the range 51 indicates the suitable bias magnetic field of −2±0.5 mT, and the area 52 indicates the installable position of the AMR element 10 corresponding to this magnetic field range.

As illustrated in FIG. 21, near the location where Bx=−2 mT on the curve of the Bx distribution, the slope of the curve 50 is small, and the installable range of the AMR element 10 becomes a size of approximately 0.5 mm.

In this way, by extending the length of the magnetic carrier 8 in the X-axis direction outward from the yoke 7a, the slope of Bx with respect to the conveyance direction becomes small, which has an advantageous effect of increasing the degree of freedom in the installation position of the AMR element 10. Note that the order of the N pole and the S pole may also be the reverse of FIGS. 16 and 18.

Embodiment 4

Figure 22:
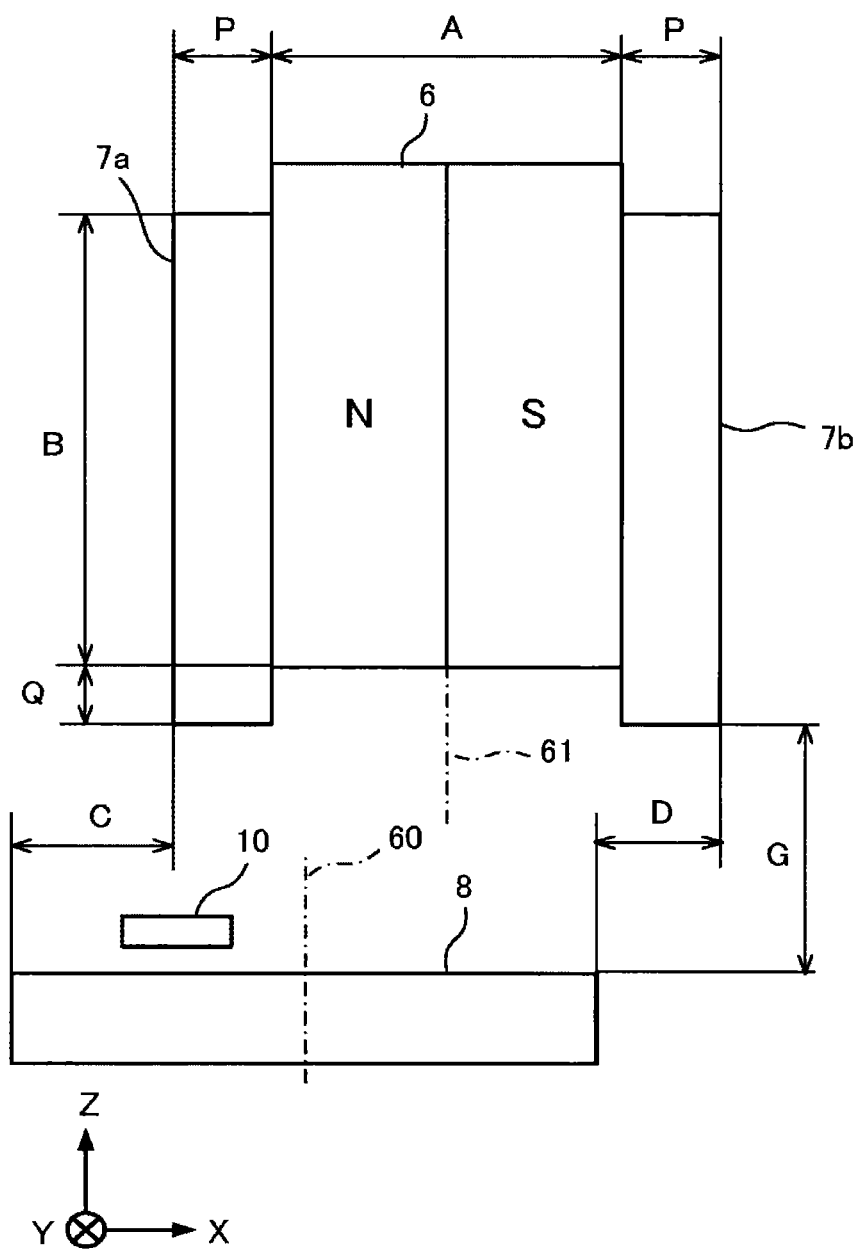
FIG. 22 is a diagram illustrating the arrangement of components constituting a magnetic circuit according to Embodiment 4 of the present disclosure.

FIG. 22 is a diagram illustrating the arrangement of components constituting a magnetic circuit according to Embodiment 4 of the present disclosure. The structural components in FIG. 22 are the same as the case of Embodiment 3, but the width of the magnetic carrier 8 is smaller than that of Embodiment 3. The yoke 7a side of the magnetic carrier 8 extends outward from the yoke 7a, but the yoke 7b side is shortened towards the magnet 6 side before the yoke 7b. The center 60 of the magnetic carrier 8 in the conveyance direction is disposed in a non-aligned state with the center 61 of the magnet 6 in the conveyance direction.

Since the magnet 6 is symmetrical about the center of the conveyance direction, the AMR element 10 may be placed on either of the insertion side and the ejection side of the conveyance path with respect to the magnet 6. It is sufficient for the magnetic carrier 8 to extend outward past the yoke 7a or 7b along the conveyance direction at least on the side where the AMR element 10 is disposed.

Figure 23:
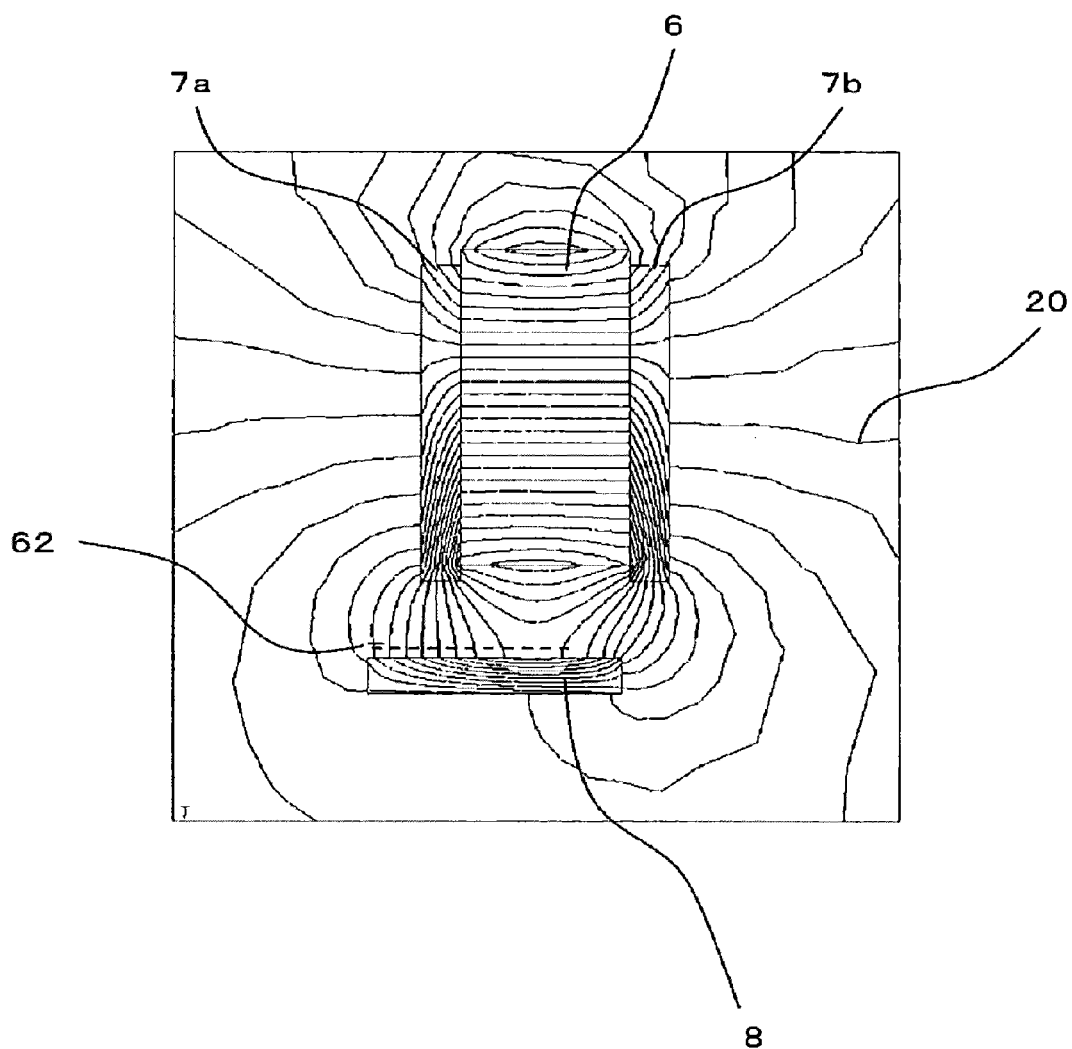
FIG. 23 is a diagram illustrating a magnetic figure in the configuration of FIG. 22.
Figure 24:
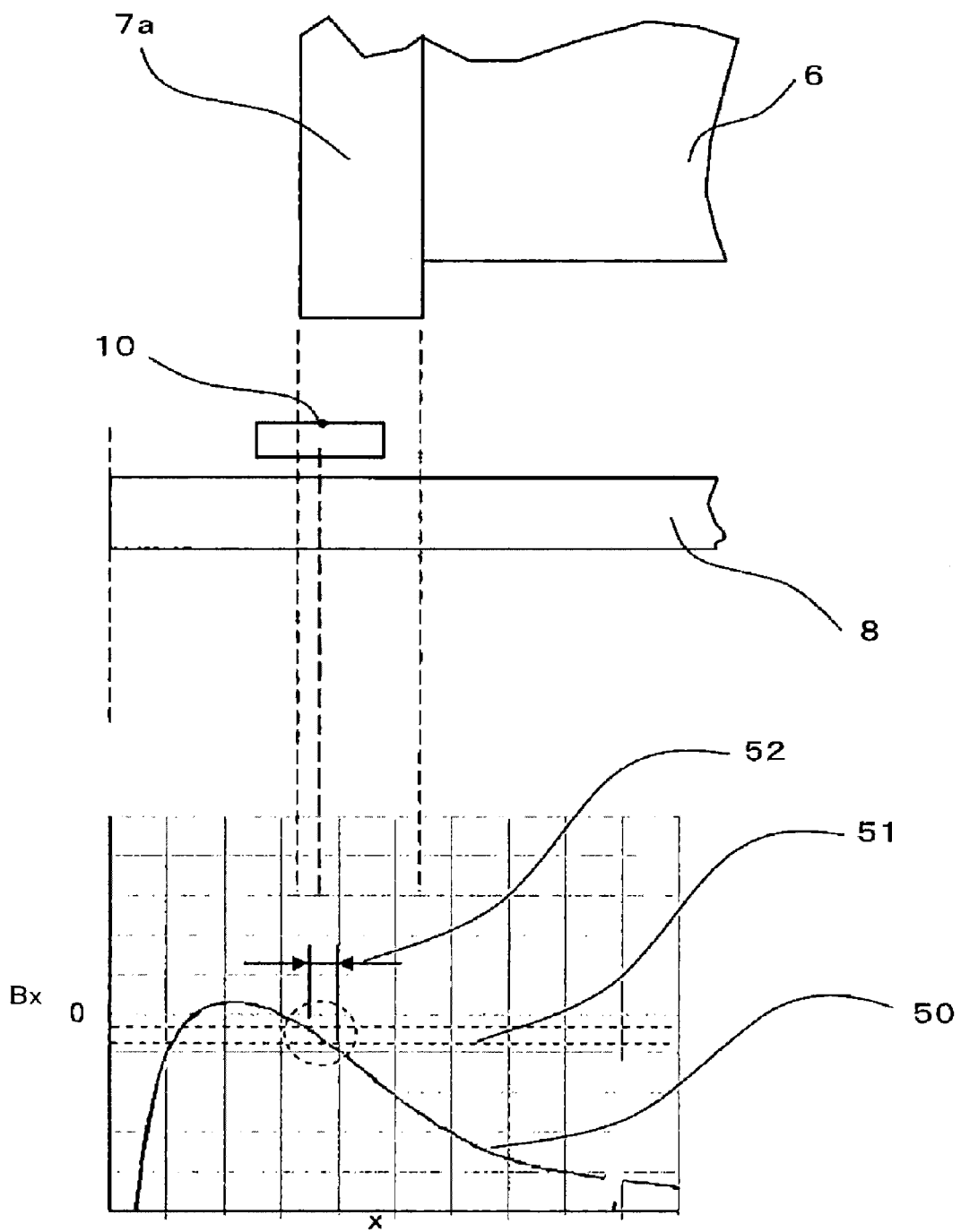
FIG. 24 is a diagram illustrating a distribution in the conveyance direction of the conveyance direction component of the magnetic flux density in the configuration of FIG. 22.

FIG. 23 is a diagram illustrating a magnetic figure in the configuration of FIG. 22. FIG. 24 is a diagram illustrating a distribution in the conveyance direction of the conveyance direction component of the magnetic flux density in the configuration of FIG. 22. The Bx distribution at a position distanced 0.4 mm from the magnetic carrier 8 (indicated by the dashed line 62) is plotted as shown in FIG. 24. FIG. 24 is a Bx distribution when C=3.2 mm and D=2.8 mm in FIG. 22. In FIG. 24, the horizontal axis is the distance (m) when treating the left edge of the magnetic carrier 8 as x=0, while the vertical axis is the conveyance direction component of the magnetic flux density (T). The distribution of Bx is indicated by the curve 50. In FIG. 24, the range 51 indicates the suitable bias magnetic field of −2±0.5 mT, and the area 52 indicates the installable position of the AMR element 10 corresponding to this magnetic field range.

FIG. 24 demonstrates that in Embodiment 4, the slope of the magnetic flux density with respect to conveyance direction likewise may be reduced. As a result, the slope of Bx with respect to the conveyance direction becomes small, which has an advantageous effect of increasing the degree of freedom in the installation position of the AMR element 10. Furthermore, the magnetic carrier 8 in use that is formed with an iron plate or the like may be made smaller, thus contributing to a more compact configuration and lower costs.

Various modification of the foregoing embodiments are possible within the scope of the spirit of the present disclosure. The foregoing embodiments are for the purpose of describing the present disclosure, and are not intended to limit the scope of the present disclosure. The scope of the present disclosure is indicated by the attached claims rather than the embodiments. Various modifications made within the scope of the claims and their equivalents are to be included in the scope of the present disclosure.

This application claims priority based on Japanese Patent Application No. 2012-088502 and Japanese Patent Application No. 2012-088501, filed in the Japan Patent Office on Apr. 9, 2012, including specification, claims, drawings, and abstract. The disclosed contents of Japanese Patent Application No. 2012-088502 and Japanese Patent Application No. 2012-088501 are hereby incorporated in entirety by reference.

REFERENCE SIGNS LIST 1 housing
2 hollow section
3 first slit section
4 second slit section
5 object of detection (paper currency)
6 magnet
7a, 7b yoke
8 magnetic carrier
9 substrate
9a hole section of substrate
10 anisotropic magnetoresistance element (AMR element)
101a, 101b, 101c electrode of AMR element
102a, 102b resistor pattern
11 transmission line
111a, 111b, 111c electrode of transmission line
112a, 112b, 112c external pad of transmission line
12 metal wire (electrical connecting means)
13 electric shield plate
14 cable
15 processing circuit
16 non-magnetic carrier
20 line of magnetic force

The invention claimed is:

1. A magnetic sensor comprising:
  a magnet, disposed on one face of a conveyance path of an object of detection, that includes a magnetic pole of designated length along a conveyance direction of the object of detection;
  a soft magnetic body, disposed opposite the magnet along the conveyance direction with the conveyance path therebetween, that generates a cross magnetic field that crosses the conveyance path formed between the soft magnetic body and the magnet; and a magnetoresistance element, affixed to a surface of the soft magnetic body facing the conveyance path at a fixed location relative to the magnet, and having magneto-sensing action in the conveyance direction, wherein a center of the magnetoresistance element in the conveyance direction is offset forwards or backwards in the conveyance direction from a center of the magnet in the conveyance direction.

2. The magnetic sensor according to claim 1, further comprising a substrate affixed to the soft magnetic body, wherein the magnetoresistance element is affixed to the surface of the soft magnetic body exposed by a hole section formed in the substrate.

3. A magnetic sensor, comprising:

a magnet, disposed on one face of a conveyance path of an object of detection, that includes a magnetic pole of designated length along a conveyance direction of the object of detection;

a magnetic body, disposed opposite the magnet along the conveyance direction with the conveyance path therebetween, that generates a cross magnetic field that crosses the conveyance path formed between the magnetic body and the magnet; and a magnetoresistance element, affixed to a surface of the magnetic body facing the conveyance path at a fixed location relative to the magnet, and having magneto-sensing action in the conveyance direction, wherein a center of the magnetoresistance element in the conveyance direction is offset forwards or backwards in the conveyance direction from a center of the magnet in the conveyance direction; and on a face of the magnetic body facing the magnet and closest to the magnet, an edge on the side where the center of the magnetoresistance element in the conveyance direction is offset in the conveyance direction from the center of the magnet in the conveyance direction extends past a range of the magnet from an edge of the magnet in the conveyance direction on the same side.

4. The magnetic sensor according to claim 3, wherein on the face of the magnetic body facing the magnet and closest to the magnet, an edge on the side opposite to the side where the center of the magnetoresistance element in the conveyance direction is offset in the conveyance direction from the center of the magnet in the conveyance direction lies within the range of the magnet from the edge of the magnet in the conveyance direction on the same side.

5. The magnetic sensor according to claim 3, wherein the magnet includes alternately different magnetic poles along the conveyance direction.

6. The magnetic sensor according to claim 5, comprising:

a first yoke joined to one side face of the magnet orthogonal to the conveyance direction; and a second yoke joined to another side face of the magnet orthogonal to the conveyance direction.

7. The magnetic sensor according to claim 6, wherein the magnetoresistance element is disposed farther outward of the magnet than a junction face between the magnet and the first yoke, and on the face of the magnetic body facing the magnet and closest to the magnet, the edge in the direction where the magnetoresistance element is disposed extends farther outward than the first yoke.

8. The magnetic sensor according to claim 3, comprising:

a housing having a first slit section formed in one side wall that accepts insertion of the object of detection, a second slit section formed in another side wall opposite the first slit section, parallel to the first slit section, that ejects the object of detection, and a hollow section, connected to the first slit section and the second slit section, that constitutes the conveyance path of the object of detection, a substrate that includes a hole section and a connecting pad that externally outputs changes in resistance of the magnetoresistance element, and a wire that electrically connects the connecting pad of the substrate to an output terminal of the magnetoresistance element, wherein the magnetoresistance element is affixed to the surface of the magnetic body exposed by the hole section.

* * * * *